(12) United States Patent
Lee et al.

(10) Patent No.: US 9,153,332 B2
(45) Date of Patent: Oct. 6, 2015

(54) DATA STORAGE DEVICE, CONTROLLER, AND OPERATING METHOD OF DATA STORAGE DEVICE

(71) Applicants: Wonseok Lee, Suwon-si (KR); Eun-Jin Yun, Seoul (KR); Youngkug Moon, Suwon-si (KR); Seongsik Hwang, Seoul (KR); Donghyun Sohn, Hwaseong-si (KR)

(72) Inventors: Wonseok Lee, Suwon-si (KR); Eun-Jin Yun, Seoul (KR); Youngkug Moon, Suwon-si (KR); Seongsik Hwang, Seoul (KR); Donghyun Sohn, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/059,852

(22) Filed: Oct. 22, 2013

(65) Prior Publication Data

US 2014/0112082 A1    Apr. 24, 2014

(30) Foreign Application Priority Data

Oct. 23, 2012    (KR) .......................... 10-2012-0118017

(51) Int. Cl.
| | | |
|---|---|---|
| *G11C 7/00* | (2006.01) | |
| *G11C 16/22* | (2006.01) | |
| *G11C 7/20* | (2006.01) | |
| *G11C 8/20* | (2006.01) | |
| *G11C 7/06* | (2006.01) | |

(52) U.S. Cl.
CPC ........ *G11C 16/22* (2013.01); *G11C 7/20* (2013.01); *G11C 8/20* (2013.01); *G11C 7/06* (2013.01)

(58) Field of Classification Search
CPC ........... G11C 7/22; G11C 7/06; G11C 7/1051
USPC .................. 365/189.01, 226, 189.07, 185.02, 365/185.04, 189.05
See application file for complete search history.

(56) References Cited

U.S. PATENT DOCUMENTS

| | | | | |
|---|---|---|---|---|
| 5,889,719 | A * | 3/1999 | Yoo et al. ....................... | 365/226 |
| 6,522,577 | B1 | 2/2003 | Earl et al. | |
| 7,362,644 | B2 | 4/2008 | Yang et al. | |
| 7,408,475 | B2 * | 8/2008 | Sugama et al. ............... | 340/663 |
| 7,596,045 | B2 | 9/2009 | DeBrosse et al. | |
| 7,712,147 | B2 | 5/2010 | Lenssen et al. | |
| 7,747,926 | B2 | 6/2010 | Wise et al. | |
| 7,808,828 | B2 * | 10/2010 | Sakurai et al. ........... | 365/185.18 |
| 8,051,331 | B2 * | 11/2011 | Oodate et al. ................... | 714/36 |
| 8,705,294 | B2 * | 4/2014 | Jeong ....................... | 365/189.05 |
| 2006/0146597 | A1 | 7/2006 | Lenssen et al. | |

* cited by examiner

Primary Examiner — Connie Yoha
(74) Attorney, Agent, or Firm — Harness, Dickey & Pierce, P.L.C.

(57) ABSTRACT

A nonvolatile memory is provided which includes a memory cell array including a plurality of nonvolatile memory cells; a decoder connected with the memory cell array through a plurality of word lines; a data input/output circuit connected with the memory cell array through a plurality of bit lines; a voltage detector configured to detect a variation in a power supply voltage to output a voltage variation signal; and control logic configured to control the decoder and the data input/output circuit such that data stored at the memory cell array is invalidated in response to the voltage variation signal.

34 Claims, 28 Drawing Sheets

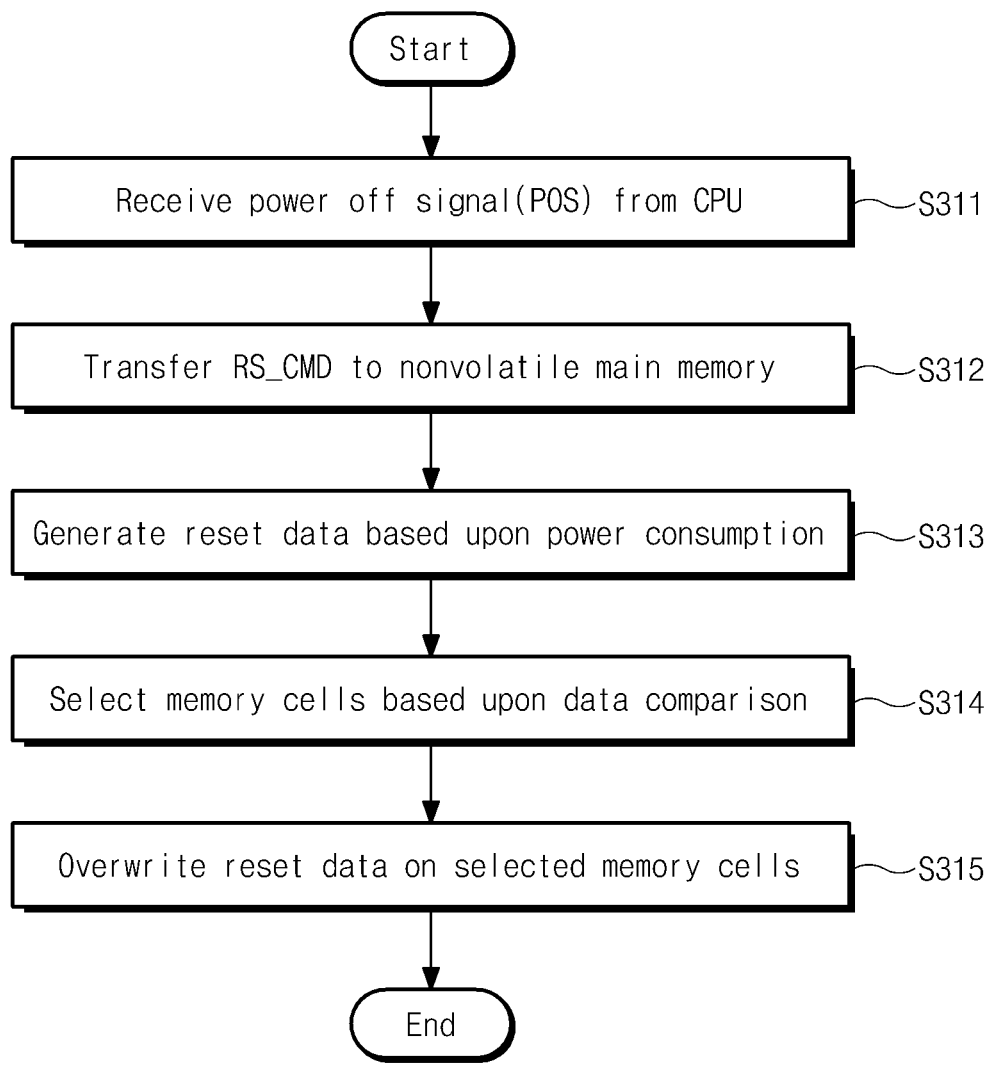

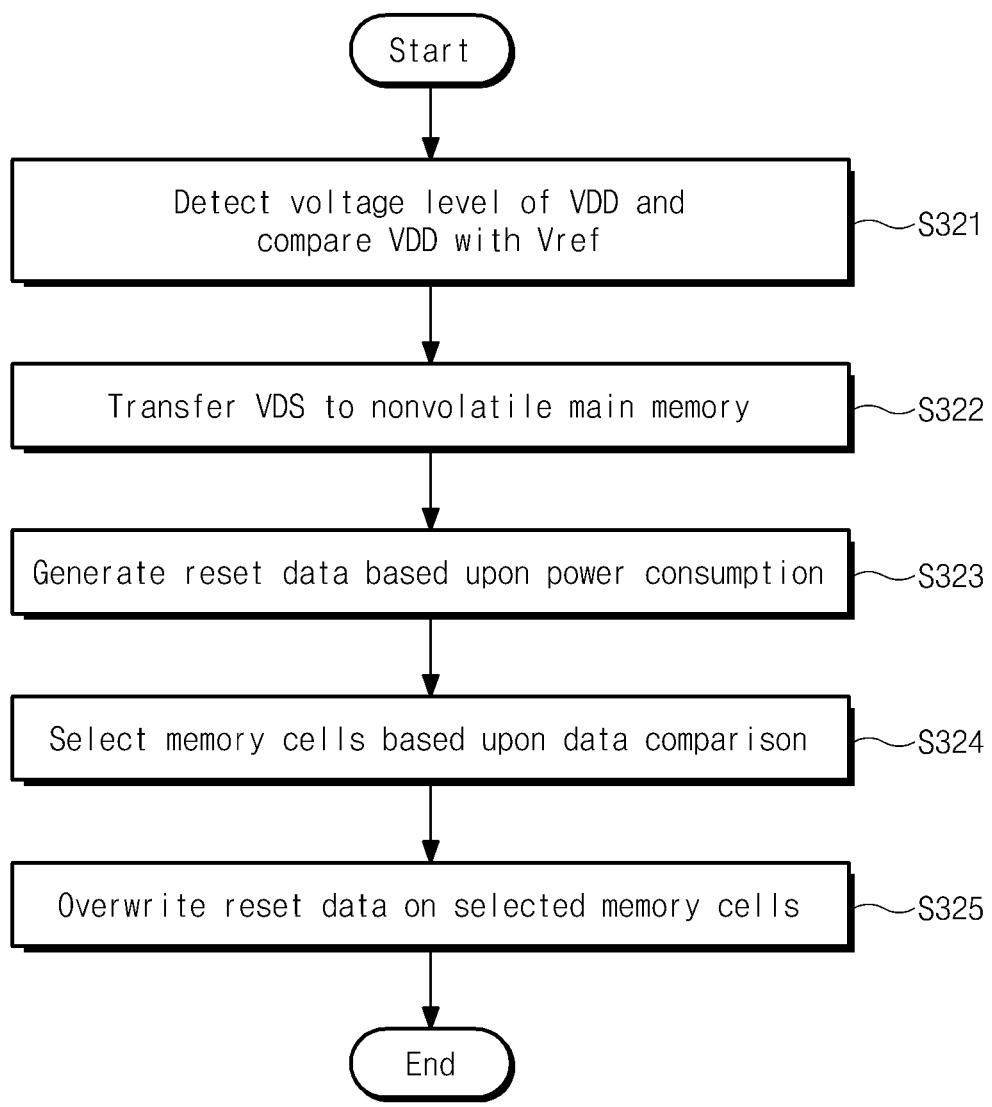

DATA STORAGE DEVICE, CONTROLLER, AND OPERATING METHOD OF DATA STORAGE DEVICE

CROSS-REFERENCE TO RELATED APPLICATIONS

A claim for priority under 35 U.S.C. §119 is made to Korean Patent Application No. 10-2012-0118017 filed Oct. 23, 2012, in the Korean Intellectual Property Office, the entire contents of which are hereby incorporated by reference.

BACKGROUND

1. Field

Example embodiments of the inventive concepts described herein relate to a data storage device using a semiconductor memory as a storage device, a controller, and an operating method of the data storage device.

2. Related Art

A semiconductor memory device is a memory device which is fabricated using semiconductors such as silicon (Si), germanium (Ge), gallium arsenide (GaAs), indium phosphide (InP), and so on. Semiconductor memory devices are classified into volatile memory devices and nonvolatile memory devices.

The volatile memory devices may lose stored contents at power-off. The volatile memory devices include, for example, a static RAM (SRAM), a dynamic RAM (DRAM), a synchronous DRAM (SDRAM), and the like. The nonvolatile memory devices may retain stored contents even at power-off. The nonvolatile memory devices include, for example, a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and so on.

SUMMARY

One aspect of embodiments of the inventive concept is directed to provide a nonvolatile memory which comprises a memory cell array including a plurality of nonvolatile memory cells; a decoder connected with the memory cell array through a plurality of word lines; a data input/output circuit connected with the memory cell array through a plurality of bit lines; a voltage detector configured to detect a variation in a power supply voltage to output a voltage variation signal; and control logic configured to control the decoder and the data input/output circuit such that data stored at the memory cell array are invalidated in response to the voltage variation signal.

In example embodiments, the voltage detector detects whether the power supply voltage is lower than a predetermined level, to output the voltage variation signal according to the detection result.

In example embodiments, the control logic invalidate the data by controlling the decoder and the data input/output circuit such that the nonvolatile memory cells of the memory cell array are overwritten with data '1' or data '0'.

In example embodiments, the control logic controls the decoder and the data input/output circuit such that the nonvolatile memory cells of the memory cell array are overwritten with data, necessitating less power consumption, from among data '1' and data '0'.

In example embodiments, the nonvolatile memory further comprises a register configured to be set by an external device. The control logic is further configured to determine whether to invalidate the data in response to the voltage variation signal according to information set at the register and to perform invalidation selectively on the data according to the determining result.

In example embodiments, the control logic is further configured to determine whether the nonvolatile memory cells are overwritten with data '1' or data '0' at invalidation of the data, according to information of the register, and to perform an overwrite operation using the determined data.

In example embodiments, the nonvolatile memory further comprises a random data generator configured to generate random data in response to a control of the control logic. The control logic controls the decoder and the data input/output circuit such that the nonvolatile memory cells are overwritten with the random data from the random data generator.

In example embodiments, the memory cell array comprises at least two areas storing different characteristics of data, and data stored at the at least two areas is selectively invalidated in response to the voltage variation signal.

In example embodiments, the nonvolatile memory further comprises a register configured to be set by an external device. The control logic decides the at least two areas as an area to be invalided and an area not to be invalidated, based on the information of the register.

In example embodiments, the memory cell array comprises a booting information area configured to store booting information; and a normal area configured to store user data, the booting information stored at the booting information area being not invalidated by the voltage variation signal.

In example embodiments, the memory cell array comprises a security area configured to store security data; and a non-security area configured to store non-security data, the security data stored at the security area being invalidated by the voltage variation signal and the non-security data stored at the non-security area being not invalidated by the voltage variation signal.

In example embodiments, the nonvolatile memory further comprises a super capacitor configured to supply a power at power-off. The control logic is further configured to invalidate data stored at the memory cell array using a power from the super capacitor at power-off.

In example embodiments, the control logic is further configured to invalidate data stored at the memory cell array in response to a reset command from an external device.

In example embodiments, the nonvolatile memory is a random access memory.

In example embodiments, the nonvolatile memory is a magnetic random access memory (MRAM).

Another aspect of embodiments of the inventive concept is directed to provide a memory system comprising a nonvolatile memory; and a memory controller configured to control the nonvolatile memory, wherein the nonvolatile memory comprises a memory cell array including a plurality of nonvolatile memory cells; a decoder connected with the memory cell array through a plurality of word lines; a data input/output circuit connected with the memory cell array through a plurality of bit lines; a voltage detector configured to detect a variation in a power supply voltage to output a voltage variation signal; and control logic configured to control the decoder and the data input/output circuit such that data stored at the memory cell array are invalidated in response to the voltage variation signal.

Still another aspect of embodiments of the inventive concept is directed to provide a memory system comprising a nonvolatile main memory including a plurality of nonvolatile memory chips; and a memory controller configured to control the nonvolatile main memory, wherein the memory controller detects a variation in a power supply voltage to control the nonvolatile main memory such that at least one nonvolatile memory chip of the plurality of nonvolatile memory chips is invalidated.

In example embodiments, the at least one nonvolatile memory chip invalidated is previously selected by the memory controller.

In example embodiments, the nonvolatile main memory further comprises a super capacitor to power the at least one nonvolatile memory chip at power-off.

In example embodiments, the memory system further comprises a super capacitor located outside the nonvolatile main memory and configured to power the nonvolatile main memory. At power-off, the at least one nonvolatile memory chip performs an invalidation operation on stored data using a power supplied from the super capacitor.

In example embodiments, the at least one nonvolatile memory chip detects whether a power supply voltage is lower than a predetermined level and performs an invalidation operation on stored data according to the detection result.

In example embodiments, the memory controller detects a power-off to send a reset command to the at least one nonvolatile memory chip, and the at least one nonvolatile memory chip performs an invalidation operation on stored data in response to the reset command.

Still another aspect of embodiments of the inventive concept is directed to provide an operating method of a nonvolatile memory which includes a plurality of nonvolatile memory cells, the operating method operating method comprising detecting a variation in a power supply voltage; and invalidating data stored at the plurality of nonvolatile memory cells in response to the detecting.

In example embodiments, the invalidating data stored at the plurality of nonvolatile memory cells comprises overwriting the plurality of nonvolatile memory cells with data.

In example embodiments, the invalidating data stored at the plurality of nonvolatile memory cells comprises reading data stored at the plurality of nonvolatile memory cells; deciding data, necessitating less power consumption at overwriting of a part or all of the plurality of nonvolatile memory cells, from among data '1' and data '0', based on the read data; and overwriting the part or all of the plurality of nonvolatile memory cells with the data necessitating less power consumption, based on the decision result.

In example embodiments, the invalidating data stored at the plurality of nonvolatile memory cells comprises generating random data; and overwriting the plurality of nonvolatile memory cells with the random data.

In example embodiments, the operating method further comprises receiving a reset command indicating that a variation in the power supply voltage is detected; and invalidating data stored at the plurality of nonvolatile memory cells in response to the reset command.

In example embodiments, the invalidating data stored at the plurality of nonvolatile memory cells is performed using a power stored at a super capacitor.

In example embodiments, the invalidating data stored at the plurality of nonvolatile memory cells is performed selectively according to data stored at a mode register.

Still another aspect of embodiments of the inventive concept is directed to provide a computing system comprising a nonvolatile main memory; a memory controller configured to control the nonvolatile main memory; and a central processing unit configured to access the nonvolatile main memory via the memory controller and to use the nonvolatile main memory as a working memory, wherein the nonvolatile main memory comprises a memory cell array including a plurality of nonvolatile memory cells; a decoder connected with the memory cell array through a plurality of word lines; a data input/output circuit connected with the memory cell array through a plurality of bit lines; a voltage detector configured to detect a variation in a power supply voltage to output a voltage variation signal; and control logic configured to control the decoder and the data input/output circuit such that data stored at the memory cell array are invalidated in response to the voltage variation signal.

With embodiments of the inventive concept, as a nonvolatile memory is used as a main memory, a design of the main memory may be simplified and power consumption may be reduced. Also, a leakage of security data may be prevented by providing an invalidation operation on data stored at a nonvolatile main memory.

According to example embodiments of the inventive concepts, a nonvolatile memory includes a memory cell array including a plurality of nonvolatile memory cells; a voltage detector configured to detect a variation in a power supply voltage being supplied to the nonvolatile memory and to output a voltage variation signal; and a controller configured to perform an overwriting operation on the memory cell array in response to the voltage variation signal, the overwriting operation causing data stored at the memory cell array to be overwritten with reset data.

The nonvolatile memory may further include a decoder connected with the memory cell array through a plurality of word lines; and a data interface circuit configured to input data to, and output data from, the nonvolatile memory, the data interface being connected with the memory cell array through a plurality of bit lines, wherein the controller is configured such that performing the overwriting operation includes controlling the decoder and the data interface circuit to overwrite data stored at the memory cell array with the reset data.

The reset data may be one of first data values and second data values, power consumption corresponding to performing the overwriting operation using the first data values as the reset data may be different from power consumption corresponding to performing the overwriting operation using the second data values as the reset data, and the nonvolatile memory controller may be configured to perform the overwriting operation using, as the reset data, the data values which correspond to the lowest power consumption, from among the first data values and the second data values.

The first data values may be '0's and the second data values may be '1's.

BRIEF DESCRIPTION OF THE FIGURES

The above and other features and advantages of example embodiments of the inventive concepts will become more apparent by describing in detail example embodiments with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 15A is a flow chart illustrating an operation of a nonvolatile main memory of FIG. 14;

FIG. 15B is a flow chart illustrating an operation of a nonvolatile main memory of FIG. 14;

DETAILED DESCRIPTION

Figure 1:
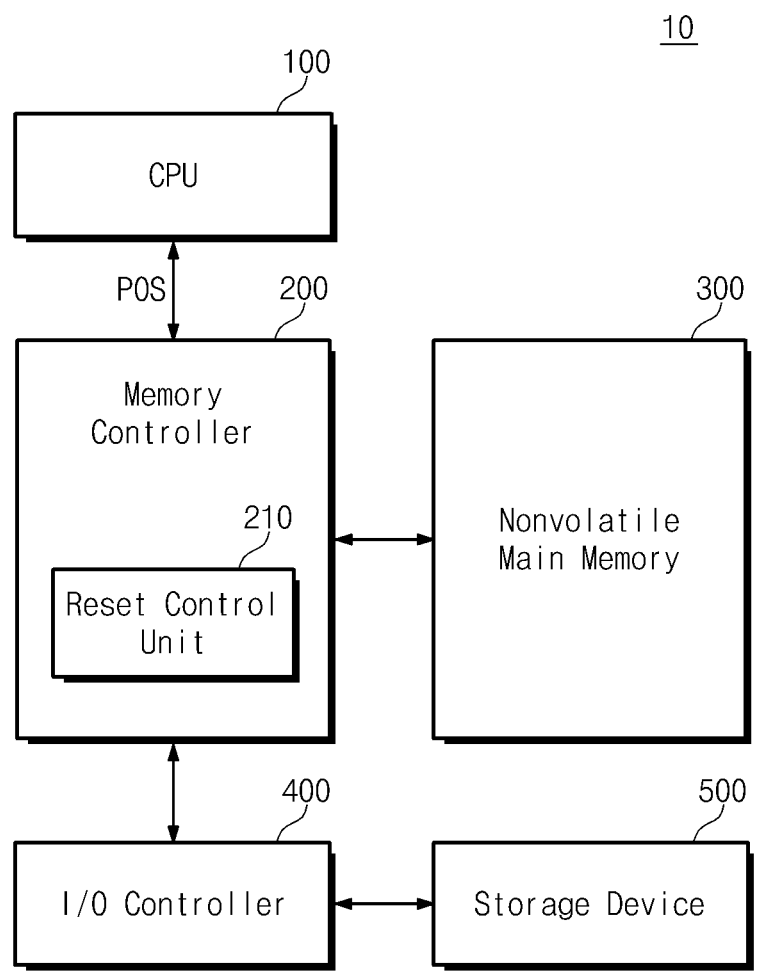
FIG. 1 is a block diagram schematically illustrating a memory system according to example embodiments of the inventive concepts.

Detailed example embodiments of the inventive concepts are disclosed herein. However, specific structural and functional details disclosed herein are merely representative for purposes of describing example embodiments. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

I. Memory System Resetting Nonvolatile Main Memory

FIG. 1 is a block diagram schematically illustrating a memory system 10 according to example embodiments of the inventive concepts.

A general memory system may use a volatile memory (e.g., DRAM) as a main memory. In this case, data stored at the main memory may be refreshed periodically or backed up to a nonvolatile memory due to a data volatile characteristic of the volatile memory. This may cause an increase in design complexity and power consumption of the main memory.

On the other hand, a memory system 10 according to example embodiments of the inventive concepts may include a nonvolatile memory as a main memory. Thus, compared with the case that a volatile memory is used as a main memory, the memory system 10 according to example embodiments of the inventive concepts may reduce power consumption and be easy or less difficult to design in comparison to conventional volatile memory.

If a nonvolatile memory is used as a main memory, data processed at the main memory (or, data being processed) may be retained after power-off. This may mean that security data is retained at the main memory regardless of intension of a user. Thus, if the main memory is detached from the memory system 10 and then attached to another memory system, the security data may be leaked.

To prevent the security data from being leaked, the memory system 10 according to example embodiments of the inventive concepts may invalidate data stored at the main memory at power-off. It is possible to prevent the security data from being leaked by invalidating the main memory at power-off.

Referring to FIG. 1, a memory system 10 may include a CPU 100, a memory controller 200, a nonvolatile main memory 300, an input/output controller 400, and a storage device 500.

The CPU 100 may control an overall operation of the memory system 10. For example, the CPU 100 may control components of the memory system 10 in response to an external request such that a write operation, a read write, or an arithmetic operation is performed.

The memory controller 200 may receive a write command from the CPU 100, and may control the nonvolatile main memory 300 such that write requested data (hereinafter, referred to as write data) is stored at the storage device 500 through the nonvolatile main memory 300. The memory controller 200 may receive a read command from the CPU 100, and may control the nonvolatile main memory 300 through the nonvolatile main memory 300 and the input/output controller 400 such that a read operation corresponding to read requested data of data stored at the storage device 500 is performed. The memory controller 200 may include a reset control unit 210.

The reset control unit 210 may control the nonvolatile main memory 300 such that data stored at the nonvolatile main memory 300 is invalidated. For example, the reset control unit 210 may control the nonvolatile main memory 300 such that data stored at the nonvolatile main memory 300 is invalidated at power-off. As another example, the reset control unit 210 may control the nonvolatile main memory 300 such that security data of data stored at the nonvolatile main memory 300 is selectively invalidated at power-off.

The nonvolatile main memory 300 may be used as a main memory of the memory system 10. For example, the nonvolatile main memory 300 may store data associated with a program running at the memory controller 200. Alternatively, the nonvolatile main memory 300 may store data which a program running at the CPU 100 refers to. Alternatively, the nonvolatile main memory 300 may store write data provided to the CPU 100 through the memory controller 200 or data read from the storage device 500.

The nonvolatile main memory 300 may be formed of a nonvolatile memory device such as an MRAM. Alternatively, the nonvolatile main memory 300 may be formed of a PRAM (Phase Change Random Access Memory) using a phase change material, an RRAM (Resistive Random Access Memory) using a variable resistance material such as complex metal oxide, or the like.

The input/output controller 400 may control the storage device 500 in response to a control of the CPU 100 or the memory controller 200. For example, the input/output controller 400 may respond to a control of the CPU 100 or the memory controller 200 to control the storage device 500 such that write data stored at the nonvolatile main memory 300 is stored at the storage device 500. Alternatively, the input/output controller 400 may respond to a control of the CPU 100 to control the storage device 500 such that write data stored at the storage device 500 is stored at the nonvolatile main memory 300.

The storage device 500 may store user data. For example, the storage device 500 may be implemented by a hard disk drive (HDD) or a solid state drive (SSD) using a nonvolatile memory device including, for example, a flash memory.

Alternatively, the storage device 500 may be implemented by a PRAM (Phase Change Random Access Memory) using a phase change material, an RRAM (Resistive Random Access Memory) using a variable resistance material such as complex metal oxide, or an MRAM (Magnetic Random Access Memory) using a ferromagnetic material.

As described with reference to FIG. 1, the memory system 10 may invalidate data stored at the nonvolatile main memory 300 at power-off of the memory system 10 or at a time when a power of the nonvolatile main memory 300 is removed, so that leakage of security data is prevented.

Figure 2:
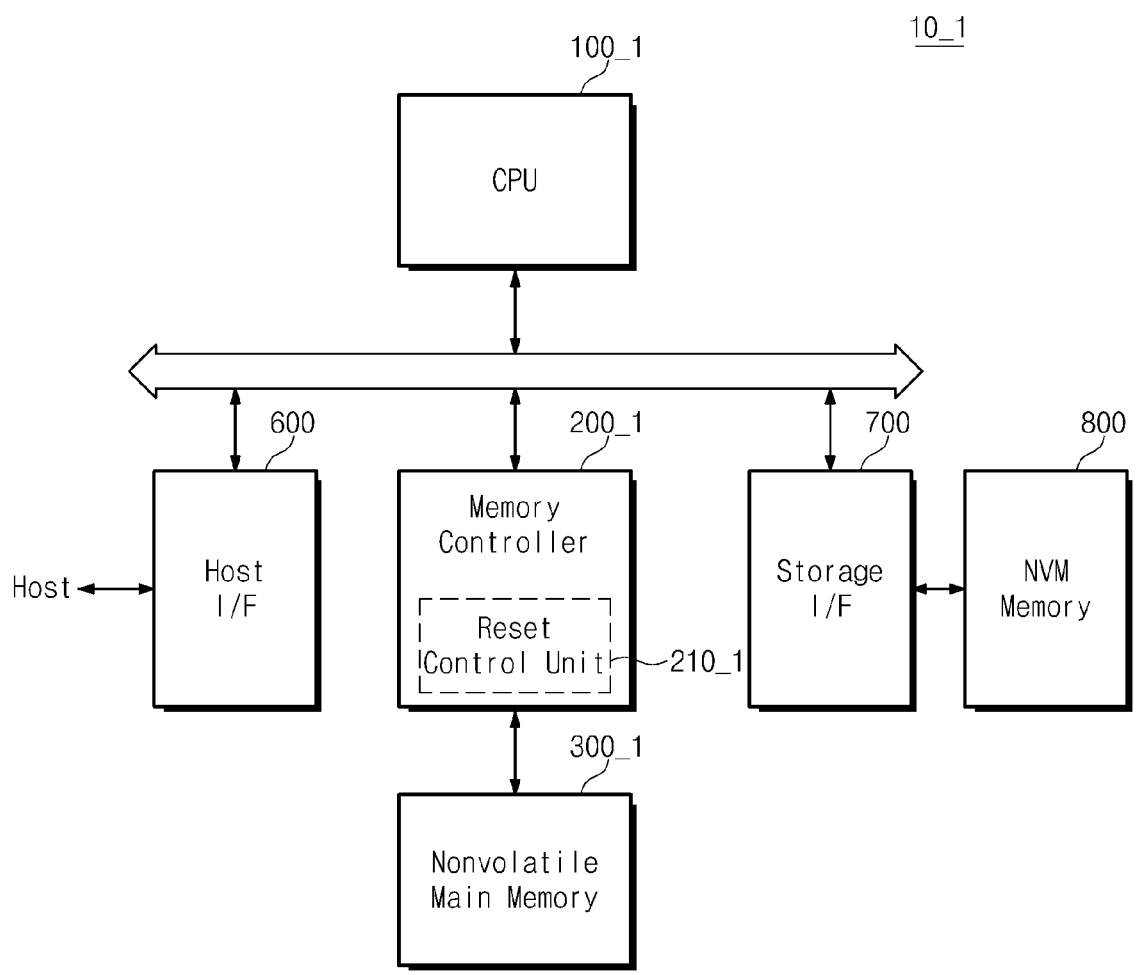
FIG. 2 is a block diagram schematically illustrating a memory system according to example embodiments of the inventive concepts.

FIG. 2 is a block diagram schematically illustrating a memory system 10_1 according to example embodiments of the inventive concepts. In FIG. 2, constituent elements which are similar to those in FIG. 1 may be marked by similar reference numerals.

A memory system 10 of FIG. 1 may be understood to show a part of the computer architecture. Also, a memory system 10_1 of FIG. 2 may be understood to show a structure of a storage device 500 of FIG. 1.

Referring to FIG. 2, a memory system 10_1 may include a CPU 100_1, a memory controller 200_1, a nonvolatile main memory 300_1, a host interface 600, a storage interface 700, and a nonvolatile memory 800.

The nonvolatile main memory 300_1 may operate responsive to a control of the memory controller 200_1, and may exchange data with the memory controller 200_1. The nonvolatile main memory 300_1 may be implemented by a nonvolatile memory device, for example an MRAM, a PRAM, or an RRAM as described with reference to FIG. 1. The MRAM may be used to replace a DRAM by virtue of characteristics such as fast read and write speeds, overwriting, compatibility with a DRAM interface, and so on. For ease of description, it is assumed that nonvolatile main memories 300 and 300_1 of FIGS. 1 and 2 are implemented by the MRAM.

In the case that the nonvolatile main memory 300/300_1 is implemented by the MRAM, it may exchange data with memory controller 200/200_1 using a DRAM interface manner. For example, the nonvolatile main memory 300/300_1 may exchange data with memory controller 200/200_1 using an asynchronous DRAM interface manner. Alternatively, the nonvolatile main memory 300/300_1 may exchange data with memory controller 200/200_1 using a synchronous DRAM interface manner (e.g., SDRAM interfaces such as DDR1, DDR2, DDR3, etc.).

A reset control unit 210/210_1 may control the nonvolatile main memory 300/300_1 such that data stored at the nonvolatile main memory 300/300_1 is invalidated at power-off. That is, in the case that a power from an external device is interrupted, the reset control unit 210/210_1 may reset the nonvolatile main memory 300/300_1.

For example, if a user requests power-off on the memory system 10/10_1, the reset control unit 210/210_1 may receive a power off signal from a CPU 100/100_1. Alternatively, the memory controller 200/200_1 may internally generate the power off signal by detecting a level of a power supply voltage from the external device. The reset control unit 210/210_1 may provide the nonvolatile main memory 300/300_1 with a reset command in response to the power-off request. The nonvolatile main memory 300/300_1 may invalidate stored data in response to the reset command.

As illustrated in FIG. 1/2, the reset control unit 210/210_1 of FIG. 1/2 may be implemented in the memory controller 200/200_1. However, the inventive concepts are not limited thereto. For example, the reset control unit 210/210_1 may be implemented by a separate unit independently from the memory controller 200/200_1.

The CPU 100/100_1 may control an overall operation of the memory controller 200/200_1. The host interface 600 of FIG. 2 may provide an interface with a host (not shown), and the storage interface 700 of FIG. 2 may provide an interface with a storage device 800.

As illustrated with reference to FIGS. 1 and 2, it is possible to prevent security data from being leaked by invalidating data stored at the nonvolatile main memories 300 and 300_1 at power-off.

The memory system 10/10_1 may further comprise a super capacitor to supply a power needed for the invalidation operation at power-off. In particular, the super capacitor may be provided to cope with generation of sudden power-off. This will be more fully described with reference to FIG. 21.

Figure 3:
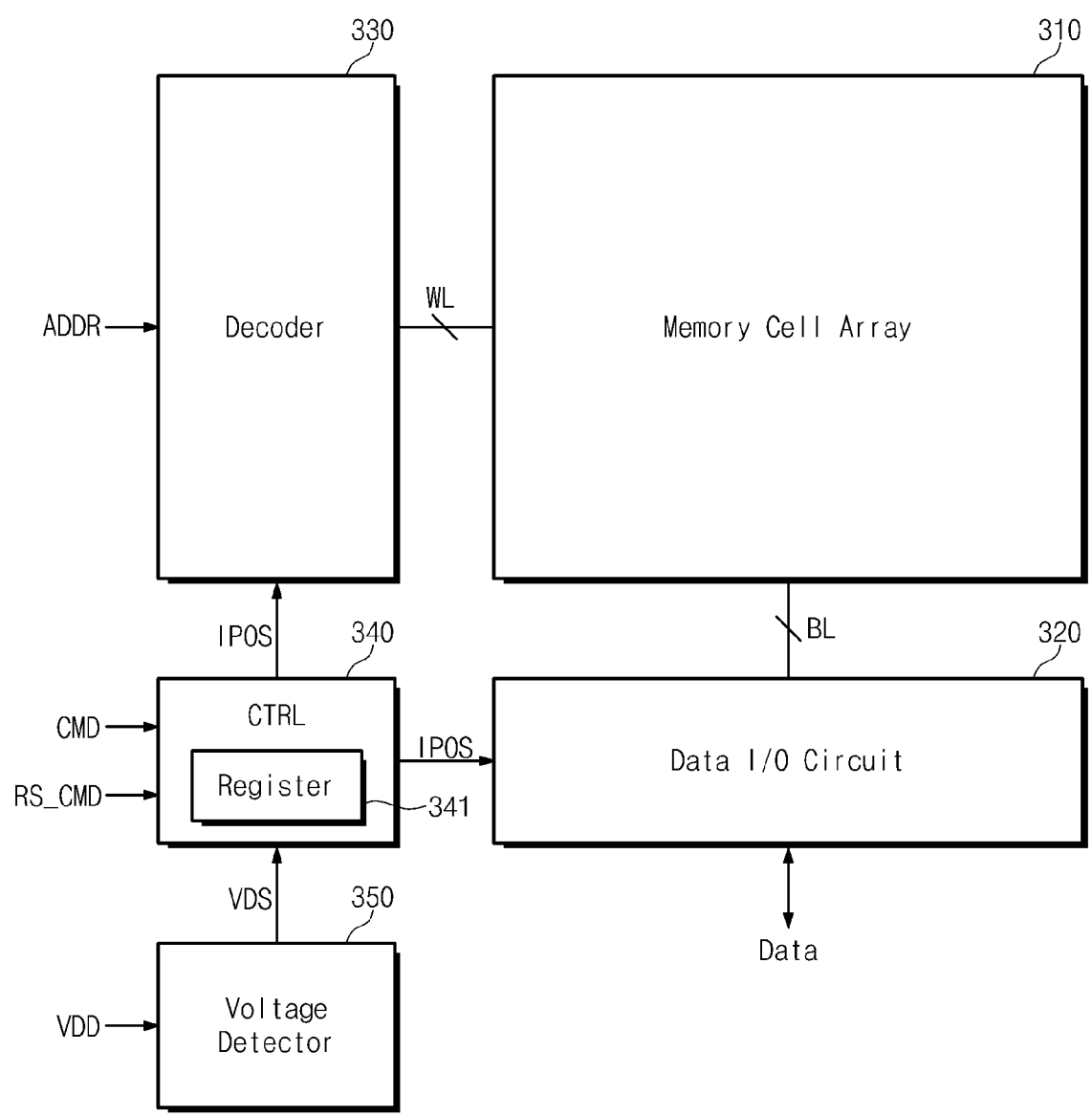
FIG. 3 is a block diagram schematically illustrating a nonvolatile main memory of FIG. 1/2.

FIG. 3 is a block diagram schematically illustrating a non-volatile main memory 300/300_1 of FIG. 1/2. Referring to FIG. 3, a nonvolatile main memory 300/300_1 may include a memory cell array 310, a data input/output circuit 320, a decoder 330, control logic 340, and a voltage detector 350.

The memory cell array 310 may include a plurality of memory cells. For example, the memory cell array 310 may include STT-MRAM (Spin Torque Transfer Magneto-resistive Random Access Memory) cells. In this case, each memory cell may include a magnetic tunnel junction element (hereinafter, referred to as a resistance element) having a magnetic material. The memory cell array 310 and memory cells of the memory cell array 310 will be more fully described with reference to FIGS. 4 to 10.

The data input/output circuit 320 may be connected with the memory cell array 310 via bit lines BL. The data input/output circuit 320 may receive data from an external device to store it at the memory cell array 310. The data input/output circuit 320 may read data from the memory cell array 310 to transfer it to the external device.

In the event that the memory cells of the memory cell array 310 are formed of STT-MRAM cells, the data input/output circuit 320 may be configured to provide a write current and a read current to the memory cells. For example, the data input/output circuit 320 may provide the write current to the memory cell array 310 at a write operation. The data input/output circuit 320 may provide the read current to the memory cell array 310 at a read operation.

The data input/output circuit 320 may be configured to include a plurality of sense amplifiers. For example, at a read operation, each sense amplifier may receive a data voltage via a bit line to compare the input data voltage with a reference voltage. Each sense amplifier may output the comparison result as a data signal having a digital level.

The decoder 330 may be connected with the memory cell array 310 via word lines. The decoder 330 may select a word line corresponding to an address ADDR input from the external device.

The control logic 340 may control an overall operation of the nonvolatile main memory 300/300_1. For example, at a write operation, the control logic 340 may control the decoder 330 and the data input/output circuit 320 such that data input from the external device is stored at the memory cell array 310. At a read operation, the control logic 340 may control the decoder 330 and the data input/output circuit 320 such that read requested data is read from the memory cell array 310.

In example embodiments, if a power-off request is received from a user, the control logic 340 may receive a reset command RS_CMD from a reset control unit 200/200_1 of a memory controller 200/200_1. The control logic 340 may generate an internal power off signal IPOS in response to the reset command RS_CMD to send it to the decoder 330 and the data input/output circuit 320. The decoder 330 and the data input/output circuit 320 may perform an invalidation operation on data stored at the memory cell array 310 in response to the internal power off signal IPOS.

In other example embodiments, if a power supply voltage supplied to the nonvolatile main memory 300/300_1 is interrupted, an invalidation operation on data stored at the nonvolatile main memory 300/300_1. The nonvolatile main memory 300/300_1 may include the voltage detector 350.

The voltage detector 350 may detect whether a power supply voltage is lower than a predetermined level, and may transfer a voltage decreasing signal VDS to the control logic 340 as a detection result. Like the case that the reset command RS_CMD is received, the control logic 340 may respond to the voltage down signal VDS to control the decoder 330 and the data input/output circuit 320 such that data stored at the memory cell array 310 is invalidated. At power-on, the voltage detector 350 may detect a variation in a power supply voltage to generate a voltage increasing signal VIS.

The control logic 340 may comprise a register 341. The register 341 may store information indicating whether a data invalidation operation of the nonvolatile main memory 300/300_1 is supported.

The memory controller 200/200_1 may send a command for setting a data invalidation mode and data for setting the data invalidation mode to the nonvolatile main memory 300/300_1. At this time, the register 341 may be set with information for setting of the data invalidation mode.

If the data invalidation mode is set, the nonvolatile main memory 300/300_1 may perform the invalidation operation on data stored at nonvolatile memory cells at power-off. If the data invalidation mode is not set, the nonvolatile main memory 300/300_1 may retain data stored at nonvolatile memory cells even at power-off.

The invalidation operation of example embodiments of the inventive concepts may be performed in various manners. For example, the control logic 340 may perform the invalidation operation by overwriting all memory cells of the memory cell array 310 with data '0' or '1'. In this case, the control logic 340 may control the data input/output circuit 320 such that data necessitating less power consumption at an overwrite operation is selected. This will be more fully described with reference to FIGS. 12, 13A, and 13B.

In other example embodiments, the control logic 340 may perform the invalidation operation by overwriting selected memory cells of the memory cell array 310 with data '0' or '1'. For example, in the case that selected memory cells are overwritten with data '1', the control logic 340 may perform the invalidation operation to control the decoder 330 and the data input/output circuit 320 such that memory cells having data '0' are overwritten with data '1'. A power consumed at the invalidation operation may be reduced by invalidating selected memory cells of memory cells of the memory cell array 310. This will be more fully described with reference to FIGS. 14, 15A, and 15B.

In still example embodiments, the control logic 340 may perform the invalidation operation by generating random data and overwriting memory cells of the memory cell array 310 with the random data. This will be more fully described with reference to FIGS. 16, 17A, and 17B.

In still other example embodiments, the control logic 340 may divide the memory cell array 310 into at least two areas and perform the invalidation operation on memory cells in a selected area. A power consumed at the invalidation operation may be reduced by invalidating memory cells, included in a selected area, from among memory cells of the memory cell array 310. This will be more fully described with reference to FIGS. 18 to 21.

As described with reference to FIG. 3, security data may be prevented from being leaked by invalidating data stored at the memory cell array 310 at power-off.

Figure 4:
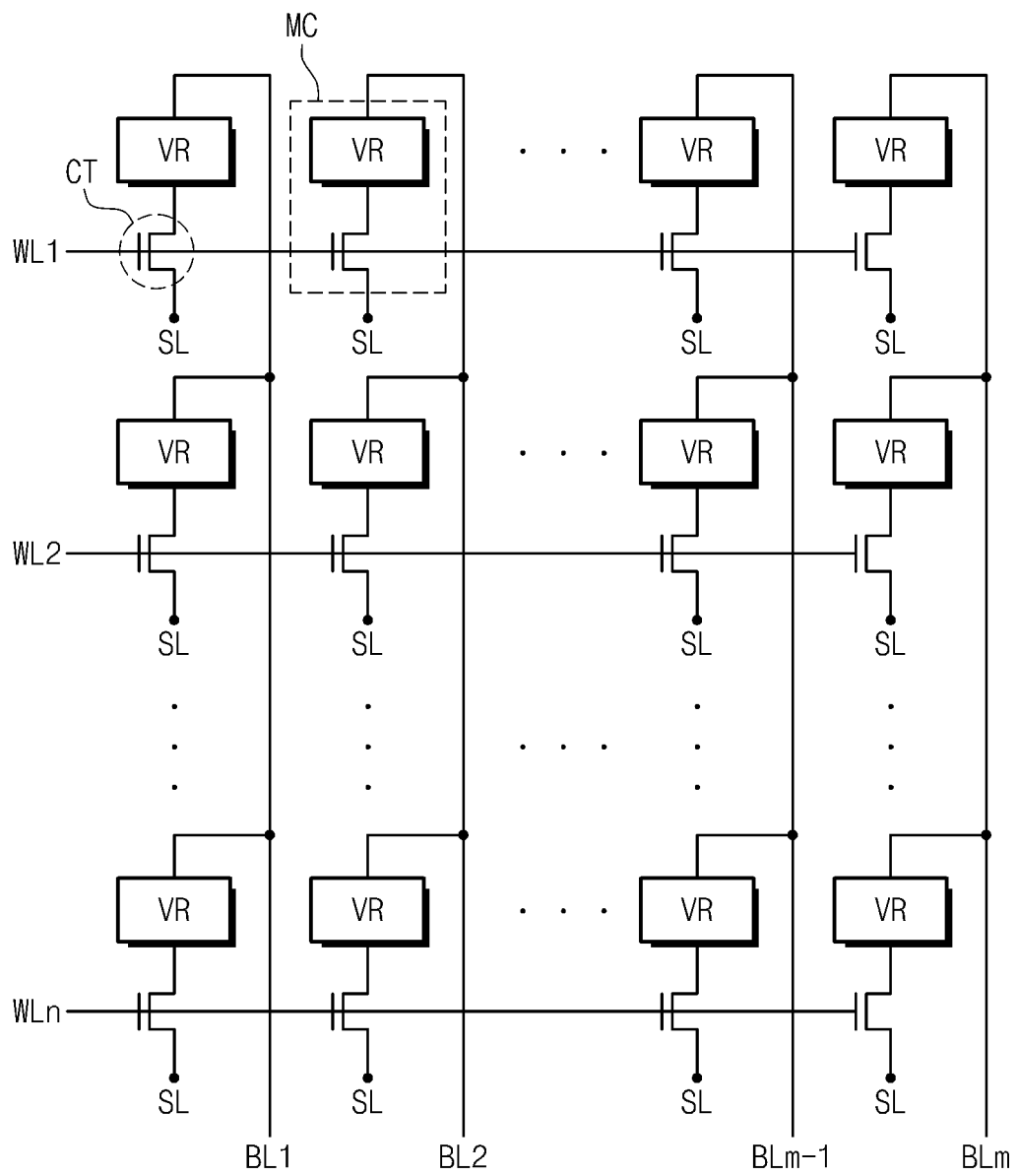
FIG. 4 is a diagram illustrating a structure of a memory cell array in FIG. 3.

FIG. 4 is a diagram illustrating a structure of a memory cell array 310 in FIG. 3. Referring to FIG. 4, a memory cell array 310 may include a plurality of memory cells MC. Each memory cell MC may include a variable resistance element VR and a cell transistor CT.

A resistance value of the variable resistance element VR may vary according to current (or voltage) level and direction. Although a current (or, a voltage) is blocked, the variable resistor element VR may maintain a resistance value. That is, the variable resistor element VR may have a nonvolatile characteristic.

The variable resistor element VR may be implemented by a variety of elements. For example, the variable resistor element VR may be implemented by an STT-M RAM element. As another example, the variable resistor element VR may be implemented by a phase change random access memory (PRAM) using a phase change material, a resistive random access memory (RRAM) using a variable resistance material of a complex metal oxide, or a magnetic random access memory (MRAM) using a ferromagnetic material.

A gate of the cell transistor CT may be connected with a word line. The cell transistor CT may be switched on or off by a signal provided through the word line. A drain of the cell transistor CT may be connected to the variable resistance element VR and a source thereof may be connected to a source line SL.

For example, all sources of the cell transistors CT of the memory cells MC may be connected with the same source line. As another example, sources of the cell transistors CT of the memory cells MC may be connected with different source lines.

Figure 5:
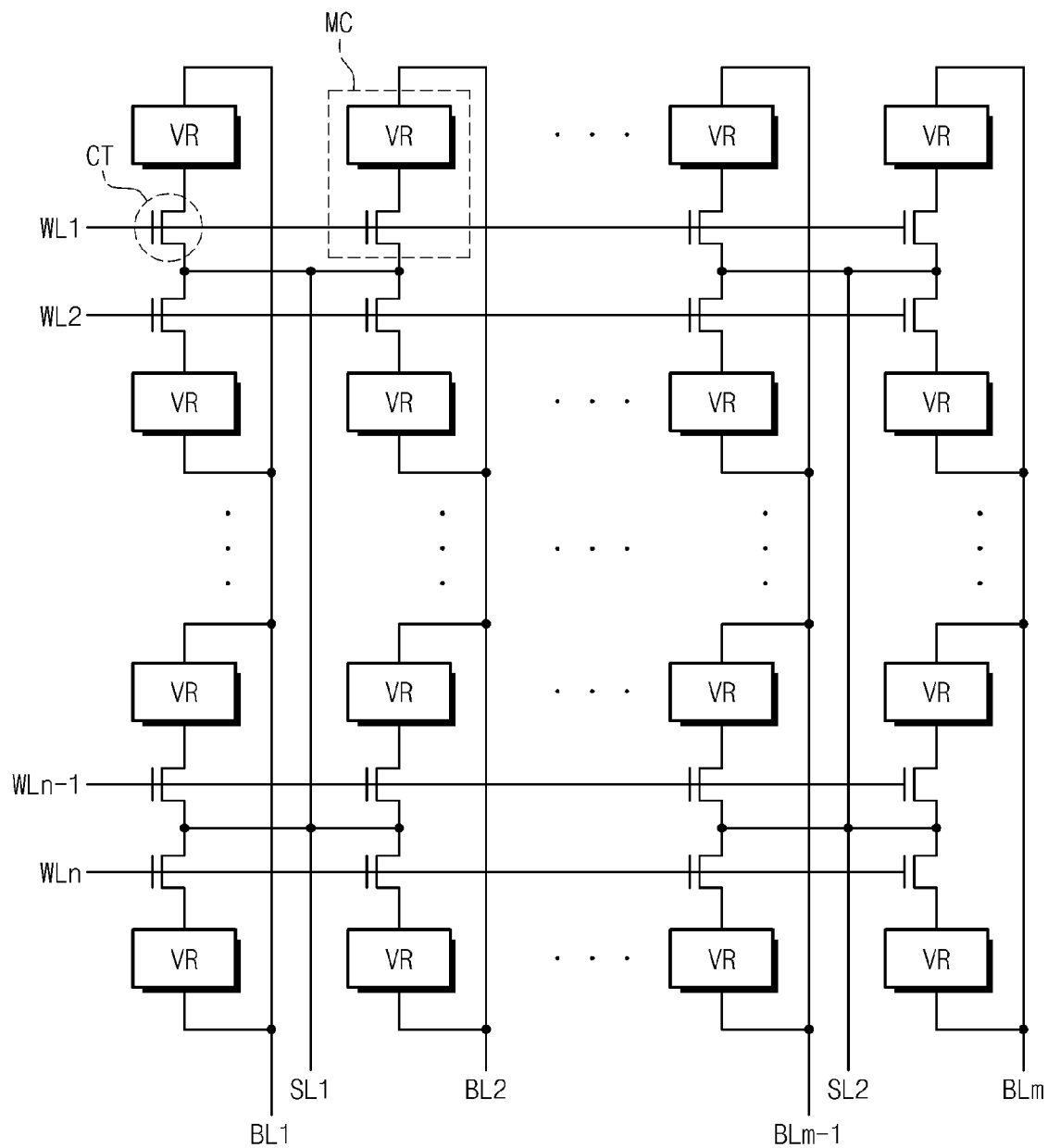
FIG. 5 is a diagram illustrating a structure of a memory cell array in FIG. 3 according to example embodiments of the inventive concepts.

FIG. 5 is a diagram illustrating a structure of a memory cell array 310 in FIG. 3 according to example embodiments of the inventive concepts.

As illustrated in FIG. 5, a memory cell array 310 may be configured such that four different memory cells MC share a source line SL. A structure of the memory cell array 310 in FIG. 5 may be similar to that in FIG. 4 except for the above-described difference, and a description thereof is thus omitted.

Figure 6:
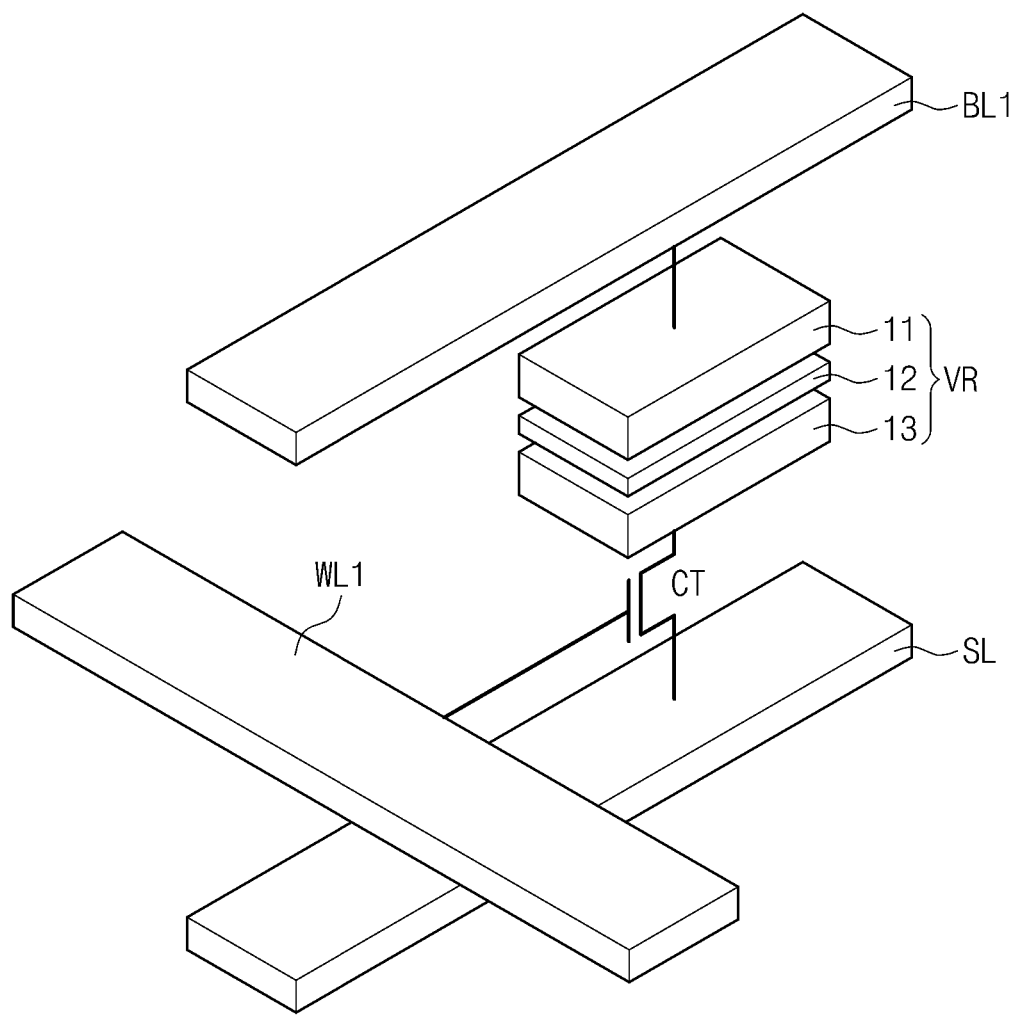
FIG. 6 is a diagram illustrating a memory cell according to example embodiments of the inventive concepts.

FIG. 6 is a diagram illustrating a memory cell according to example embodiments of the inventive concepts. In FIG. 6, there is illustrated an example in which a memory cell MC is implemented by an STT-MRAM cell.

The memory cell MC may include a variable resistance element VR and a cell transistor CT. A gate of the cell transistor CT may be connected with a word line (e.g., a first word line WL1). One electrode of the cell transistor CT may be connected with a bit line (e.g., a first bit line BL1) via the variable resistance element VR, and the other electrode thereof may be connected with a source line (e.g., a first source line SL1).

The variable resistance element VR may include a pinned layer 13, a free layer 11, and a tunnel layer 12 interposed between the pinned layer 13 and the free layer 11. A magnetization direction of the pinned layer 13 may be fixed, and a magnetization direction of the free layer 11 may be equal or opposite to that of the pinned layer 13 according to a condition. An anti-ferromagnetic layer (not shown) may be further provided to fix a magnetization direction of the pinned layer 13, for example.

Data stored at the variable resistance element VR may be determined according to a resistance value measured under a bias condition in which a logic high voltage is applied to the word line WL1 to turn on the cell transistor CT and a read current is provided in a direction from the bit line BL1 to a source line.

To execute a write operation of the STT-MRAM, a logic high voltage may be applied to the word line WL1 to turn on the cell transistor CT, and a write current may be provided between the bit line BL1 and the source line.

Figure 7:
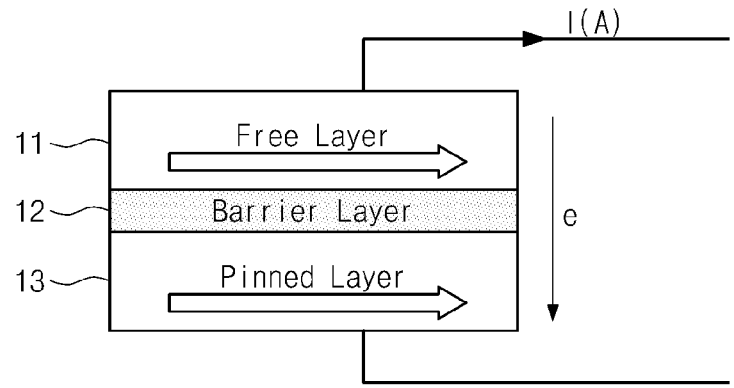
FIGS. 7 and 8 are diagrams illustrating a magnetization direction of a variable resistance element according to stored data.
Figure 8:
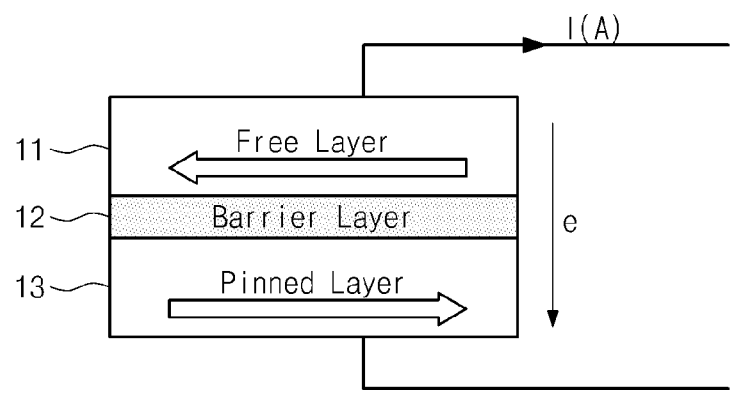

FIGS. 7 and 8 are diagrams illustrating a magnetization direction of a variable resistance element according to stored data.

A resistance value of a variable resistance element VR may vary according to a magnetization direction of a free layer 11. If a read current I is provided to the variable resistance element VR, a data voltage corresponding to a resistance value of the variable resistance element VR may be output. Since a level of the read current I is less than that of a write current, a magnetization direction of the free layer 11 may not vary by the read current I.

Referring to FIG. 7, a magnetization direction of the free layer 11 may be parallel with, or the same as, a magnetization direction of a pinned layer 13. In this case, the variable resistance element VR may have a small resistance value indicative of data '0'.

Referring to FIG. 8, a magnetization direction of the free layer 11 may be anti-parallel with, or opposite to, a magnetization direction of the pinned layer 13. In this case, the variable resistance element VR may have a large resistance value indicative of data '1'.

In FIGS. 7 and 8, the free layer 11 and the pinned layer 13 of an MTJ cell are illustrated to be a horizontal magnetic element. However, the inventive concepts are not limited thereto. As another example, the free layer 11 and the pinned layer 13 may be implemented using a vertical magnetic element.

Figure 9:
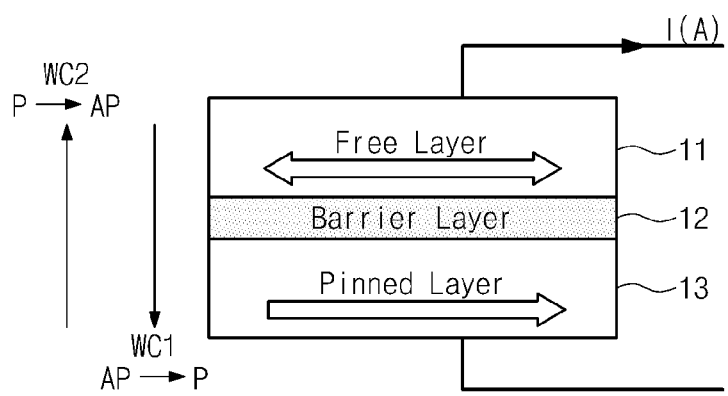
FIG. 9 is a diagram illustrating a write operation of an STT-MRAM.

FIG. 9 is a diagram illustrating a write operation of an STT-MRAM.

Referring to FIG. 9, a magnetization direction of a free layer 11 may be decided according to directions of write currents WC1 and WC2. For example, if the first write current WC1 is provided, free electrons having the same spin direction as a pinned layer 13 may apply a torque to the free layer 11. In this case, the free layer 11 may be magnetized to be parallel with the pinned layer 13.

If the second write current WC2 is provided, free electrons having a spin direction opposite to that of the pinned layer 13 may apply a torque to the free layer 11. In this case, the free layer 11 may be magnetized to be anti-parallel with the pinned layer 13. That is, a magnetization direction of the free layer 11 may be changed by a spin transfer torque (STT).

Figure 10:
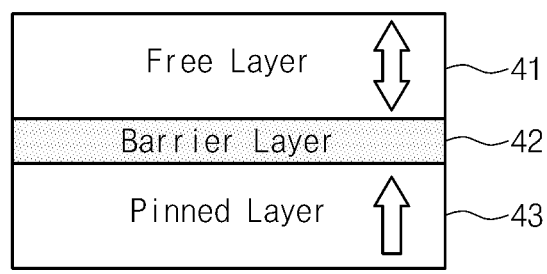
FIG. 10 is a diagram illustrating a variable resistance element of an STT-MRAM according to example embodiments of the inventive concepts.

FIG. 10 is a diagram illustrating a variable resistance element of an STT-MRAM according to still example embodiments of the inventive concepts. In a variable resistance element in which magnetization directions are vertical to each other, a current direction and an easy axis may be substantially parallel with each other. Referring to FIG. 10, a variable resistance element VR may include a free layer 41, a pinned layer 43, and a tunnel layer 42.

A resistance value may become small when a magnetization direction of the free layer 41 and a magnetization direction of the pinned layer 43 are parallel, and may become large when a magnetization direction of the free layer 41 and a magnetization direction of the pinned layer 43 are anti-parallel. Data may be stored according to a resistance value.

To implement a variable resistance element VR in which magnetization directions are vertical, it is desirable to form the free and pinned layers 41 and 43 using a material having large magnetic anisotropy energy. The material with the large magnetic anisotropy energy may include an amorphous rare-earth element alloy, a multi-layer thin film such as (Co/Pt)n or (Fe/Pt)n, and a material having an L10 crystal structure.

For example, the free layer 41 may be an ordered alloy, and may include at least one of Fe, Co, Ni, Pa, or Pt. For example, the free layer 41 may include at least one of Fe—Pt alloy, Fe—Pd alloy, Co—Pd alloy, Co—Pt alloy, Fe—Ni—Pt alloy, Co—Fe—Pt alloy, or Co—Ni—Pt alloy. The alloys may be Fe50Pt50, Fe50Pd50, Co50Pd50, Co50Pt50, Fe30Ni20Pt50, Co30Fe20Pt50, or Co30Ni20Pt50.

The pinned layer 43 may be an ordered alloy, and may include at least one of Fe, Co, Ni, Pa, or Pt. For example, the pinned layer 43 may include at least one of Fe—Pt alloy, Fe—Pd alloy, Co—Pd alloy, Co—Pt alloy, Fe—Ni—Pt alloy, Co—Fe—Pt alloy, or Co—Ni—Pt alloy. The alloys may be Fe50Pt50, Fe50Pd50, Co50Pd50, Co50Pt50, Fe30Ni20Pt50, Co30Fe20Pt50, or Co30Ni20Pt50.

As described with reference to FIGS. 4 to 10, a nonvolatile main memory 300/300_1 may be implemented using STT-MRAM. Like a DRAM, The STT-MRAM may support an overwrite operation, so that the nonvolatile main memory 300/300_1 operates in a speed equal or similar to the DRAM. The STT-MRAM may be programmed to indicate data '0' or data '1' according to a direction of current flowing to a cell. At this time, a level of a current required to program an STT-MRAM cell with data '1' or data '0' may vary according to a material of the STT-M RAM cell or a fabricating process condition. Example embodiments of the inventive concepts may reset data stored at STT-MRAM cells with data necessitating less power consumption at programming of the STT-MRAM cells for invalidation.

Figure 11A:
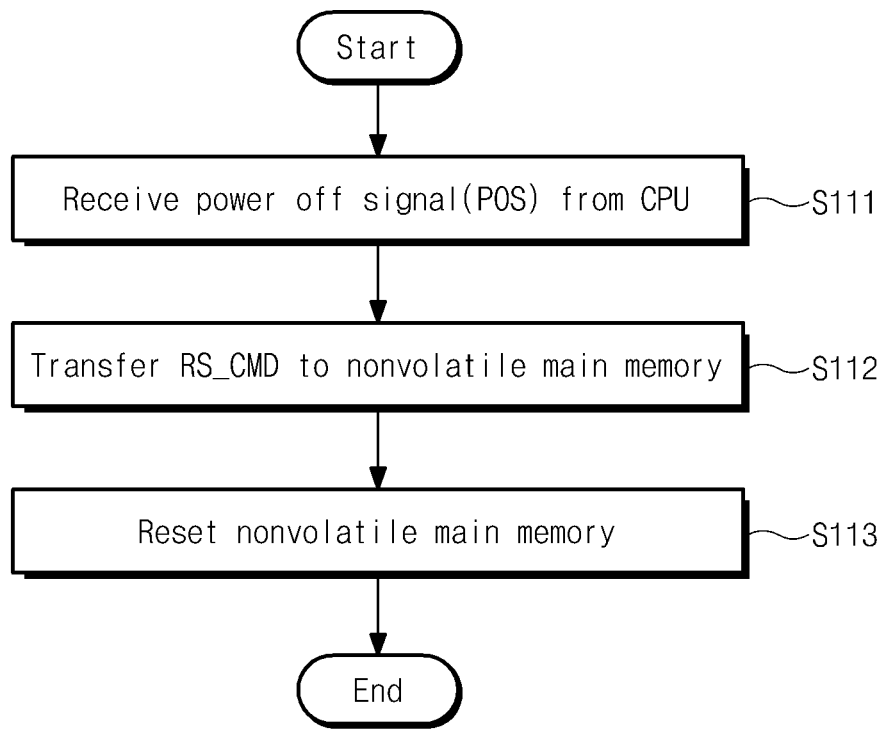
FIG. 11A is a flow chart illustrating an operation of a memory system of FIGS. 1 and 2.

FIG. 11A is a flow chart illustrating an operation of a memory system 10 of FIG. 1 and a memory system 10_1 of FIG. 2.

In operation S111, a power off signal POS may be sent from a CPU 100/100_1 to a memory controller 200/200_1. However, the inventive concepts are not limited thereto. For example, the memory controller 200/200_1 may internally detect a power-off state to generate a signal corresponding to the detection result.

In operation S112, a reset control unit 210/210_1 may provide a reset command RS_CMD to a nonvolatile main memory 300/300_1 in response to the power off signal POS or the signal corresponding to the power-off detection result.

In operation S113, control logic 340 (refer to FIG. 3) may perform an invalidation operation on data stored at a memory cell array 310 in response to the reset command RS_CMD. The control logic 340 may generate an internal power off signal IPOS in response to the reset command RS_CMD to send it to a decoder 330 and a data input/output circuit 320. The decoder 330 and the data input/output circuit 320 may reset data stored at the memory cell array in response to the internal power off signal IPOS.

Figure 11B:
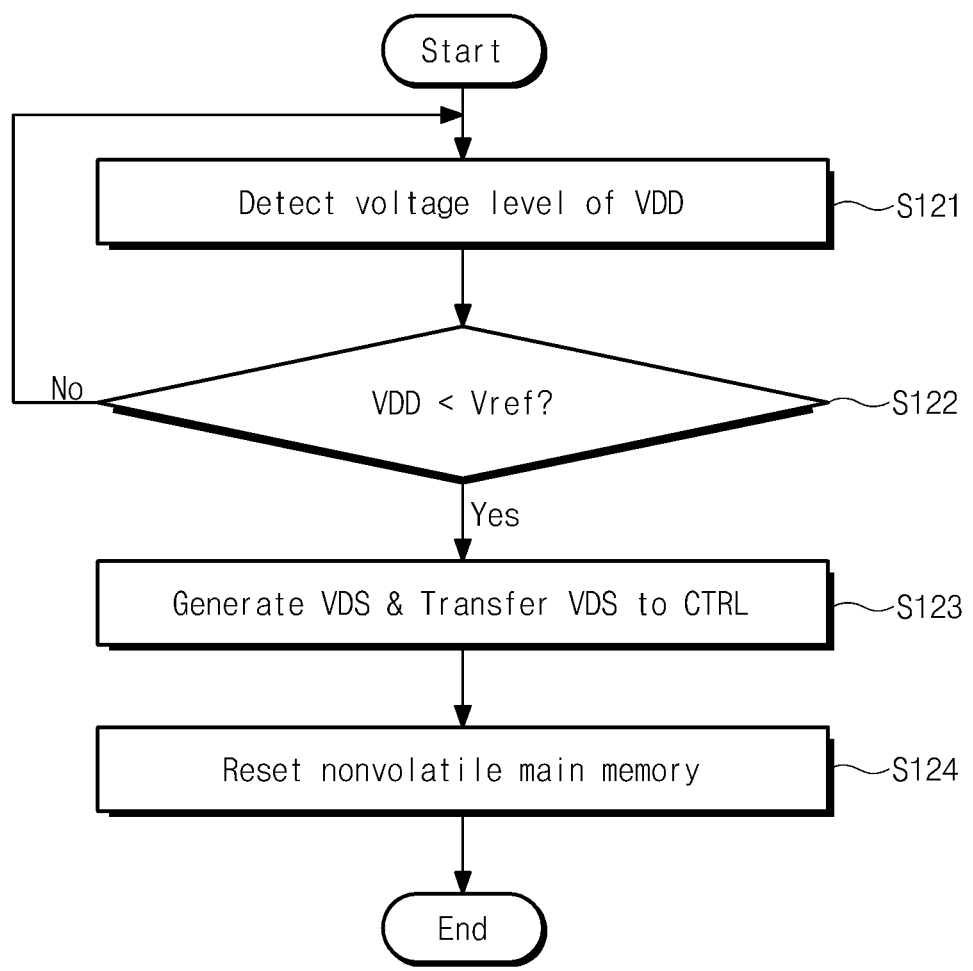
FIG. 11B is a flow chart illustrating a data invalidation operation of a nonvolatile main memory of FIGS. 1 and 2.

FIG. 11B is a flow chart illustrating a data invalidation operation of a nonvolatile main memory 300/300_1 of FIG. 1/2.

In operation S121, a voltage detector 350 of a nonvolatile main memory 300/300_1 may detect a voltage level of a power supply voltage VDD. For example, the voltage detector 350 may detect a voltage level of the power supply voltage VDD in real time. Alternatively, the voltage detector 350 may detect a voltage level of the power supply voltage VDD periodically.

In operation S122, the voltage detector 350 may compare the voltage level of the power supply voltage VDD with a reference voltage Vref.

If the voltage level of the power supply voltage VDD is equal to or lower than the reference voltage Vref, in operation S123, the voltage detector 350 may generate a control signal VDS to send the control signal VDS to control logic 340.

In operation S124, the control logic 340 may perform an invalidation operation on data stored at the nonvolatile main memory 300/300_1 in response to the control signal VDS. For example, the control logic 340 may generate an internal power off signal IPOS in response to the control signal VDS to send the internal power off signal IPOS to a decoder 330 and a data input/output circuit 320. The decoder 330 and the data input/output circuit 320 may reset data stored at the memory cell array 310 in response to the internal power off signal IPOS.

As described above, a memory system 10/10_1 may include a main memory implemented by nonvolatile memory elements. This may make it possible to simplify a design of the main memory and to reduce power consumption. Also, the memory system 10/10_1 may prevent security data from being leaked by performing an invalidation operation on data stored at a nonvolatile main memory at power-off.

Also, the memory system 10/10_1 may invalidate data of the nonvolatile main memory 300/300_1 in response to a reset command RS_CMD from the memory controller 200/200_1 at normal power-off of the memory system 10/10_1.

The nonvolatile main memory 300/300_1 may internally detect a level of a power supply voltage to invalidate stored data based on the detection result. In the event that the nonvolatile main memory 300/300_1 is formed of a detachable module or card, security may be maintained by invalidating data when the nonvolatile main memory 300/300_1 is detached from the memory system 10/10_1.

In example embodiments, an invalidation operation on data stored at the nonvolatile main memory 300/300_1 may be performed variously. Below, invalidation operations on data stored at the nonvolatile main memory 300/300_1 will be more fully described with reference to accompanying drawings.

II. Nonvolatile Main Memory Performing an Overwrite Operation with Less Power

Figure 12:
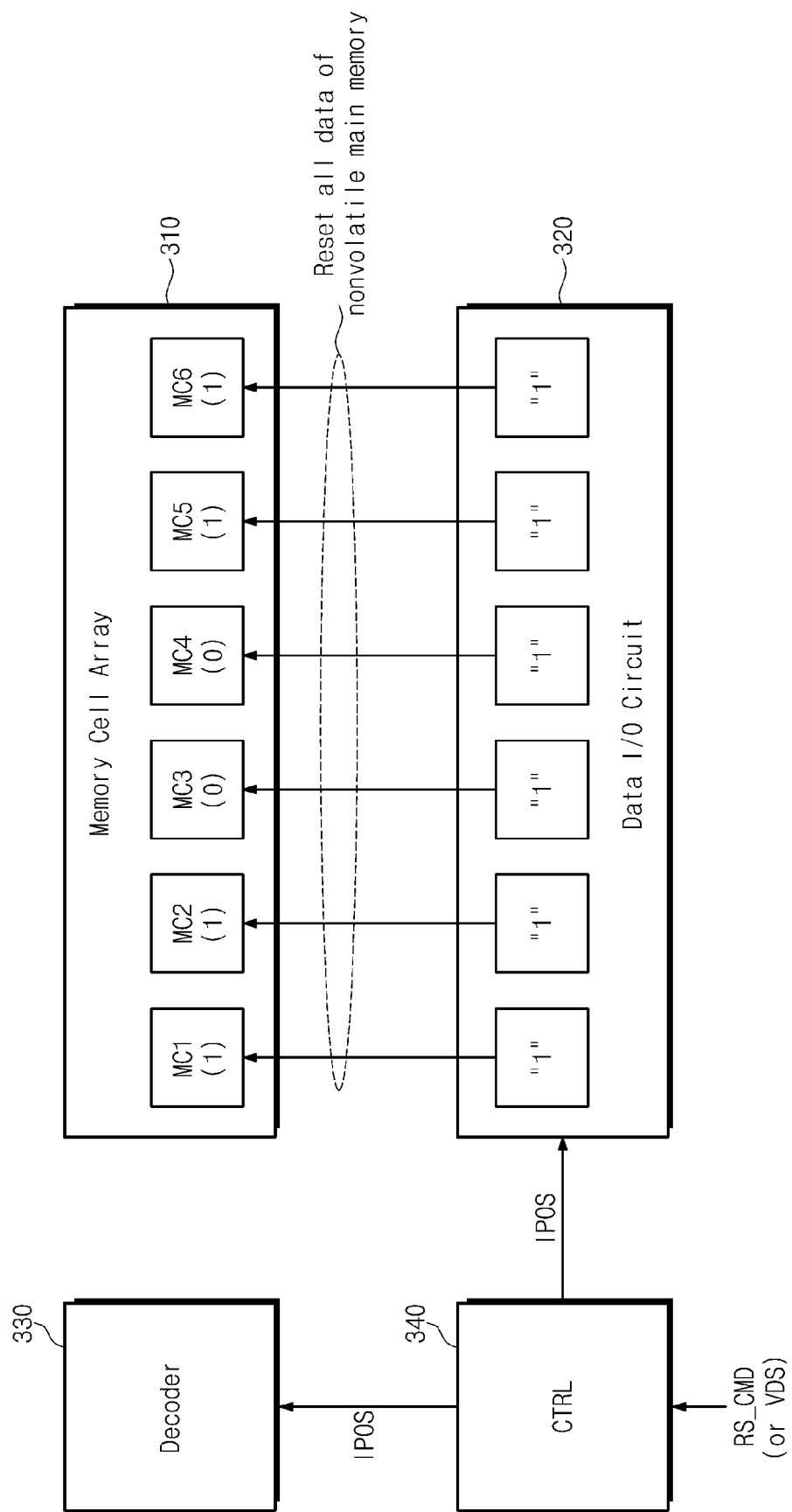
FIG. 12 is a diagram illustrating an operation of a nonvolatile main memory according to example embodiments of the inventive concepts.

FIG. 12 is a diagram illustrating an operation of a nonvolatile main memory according to example embodiments of the inventive concepts. In FIG. 12, there is illustrated an example in which an invalidation operation is executed using the same data. In this case, the invalidation operation for preventing a leakage of security data may be executed in a manner where a power consumed to perform the invalidation operation is less.

For ease of description, it is assumed that data '1' is written at memory cells of a memory cell array 310. Also, it is assumed that the memory cell array 310 includes first to sixth memory cells MC1 to MC6 and data '1' to '0' is stored at the first to sixth memory cells MC1 to MC6, respectively. A nonvolatile main memory of FIG. 12 may be the same or substantially the same as a nonvolatile main memory 300/300_1 of FIG. 3, and a duplicated description may be omitted.

Referring to FIG. 12, control logic 340 may receive a reset command RS_CMD from a reset control unit 210/210_1. Alternatively, the control logic 340 may receive a voltage decreasing signal VDS from a voltage detector 350. The control logic 340 may generate an internal power off signal IPOS in response to the reset command RS_CMD or the voltage decreasing signal VDS, and may send the internal power off signal IPOS to a decoder 330 and a data input/output circuit 320. The decoder 330 and the data input/output circuit 320 may generated reset data in response to the internal power off signal IPOS, and may provide a bit line with a voltage corresponding to the reset data.

In example embodiments, the control logic 340 may control the data input/output circuit 320 such that an overwrite operation necessitating less current consumption is performed. For example, it is assumed that a current needed to change data stored at an STT-MRAM cell from '0' to '1' is less than a current needed to change data stored at an STT-MRAM cell from '1' to '0'. In this case, the control logic 340 may control the data input/output circuit 320 so as to generate reset data '1' is generated.

In example embodiments, whether to generate data '0' or data '1' may be decided according to a cell characteristic when a nonvolatile memory is fabricated. For example, whether a current needed to overwrite data '0' is less than a current needed to overwrite data '1' may be decided according to an STT-MRAM characteristic when fabricated. When a register of FIG. 3 is set to indicate whether an invalidation mode is supported, data to be overwritten of data '1' and data '0' may be set together.

Data '1' generated may be stored at the memory cells MC1 to MC6 of the memory cell array 310 in response to a control of the control logic 340. In this case, since the STT-M RAM supports the overwrite operation, data '1' may be overwritten at the memory cells MC1 to MC6 of the memory cell array 310.

Figure 13A:
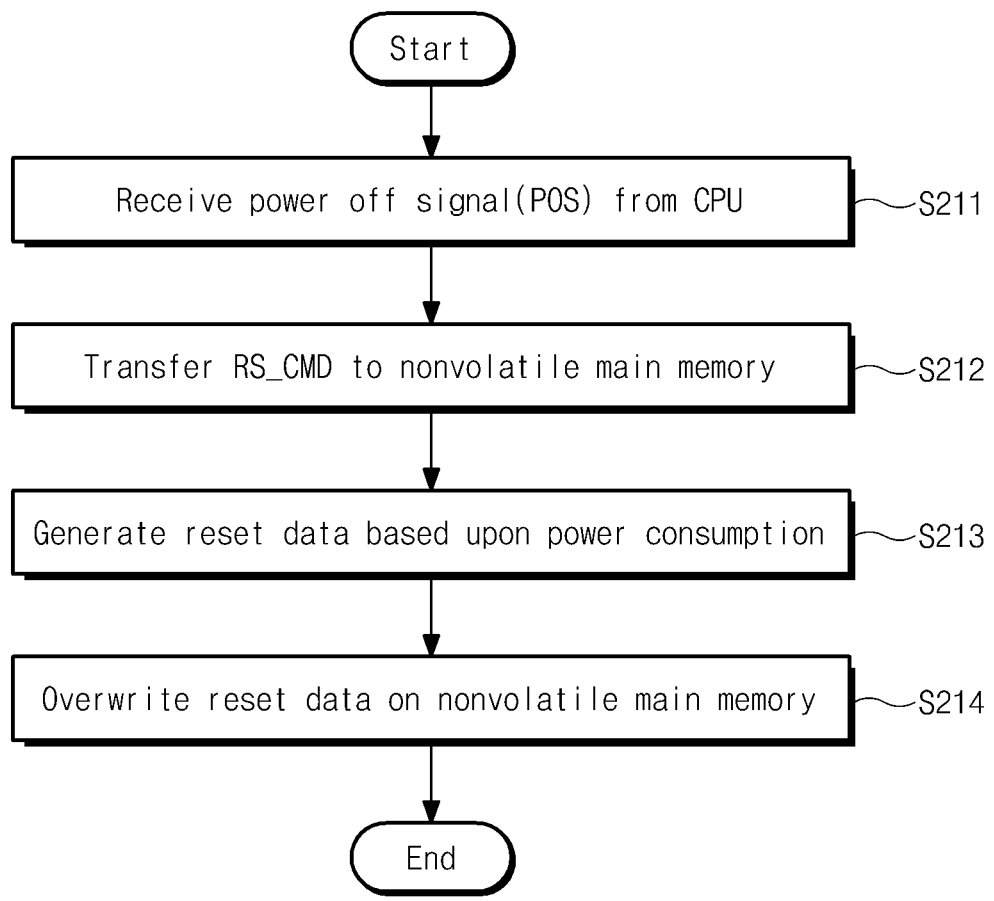
FIG. 13A is a flow chart illustrating an operation of a nonvolatile main memory of FIG. 12.

FIG. 13A is a flow chart illustrating an operation of a nonvolatile main memory of FIG. 12. In FIG. 13A, there is described an operation of a nonvolatile main memory when a reset command RS_CMD is received.

In operation S211, a memory controller 200/200_1 may receive a power off signal POS from a CPU 100/100_1.

In operation S212, a reset control unit 210/210_1 may generate a reset command RS_CMD in response to the power off signal POS, and may send the reset command RS_CMD to a nonvolatile main memory 300/300_1.

In operation 213, control logic 340 may generate reset data in response to the reset command RS_CMD. That is, the control logic 340 may generate an internal power off signal IPOS in response to the reset command RS_CMD, and a data input/output circuit 320 may generate reset data necessitating less current consumption in response to the internal power off signal IPOS.

In operation S214, the reset data may be overwritten at a nonvolatile main memory, for example by overwriting data currently stored in the nonvolatile main memory with the reset data.

Figure 13B:
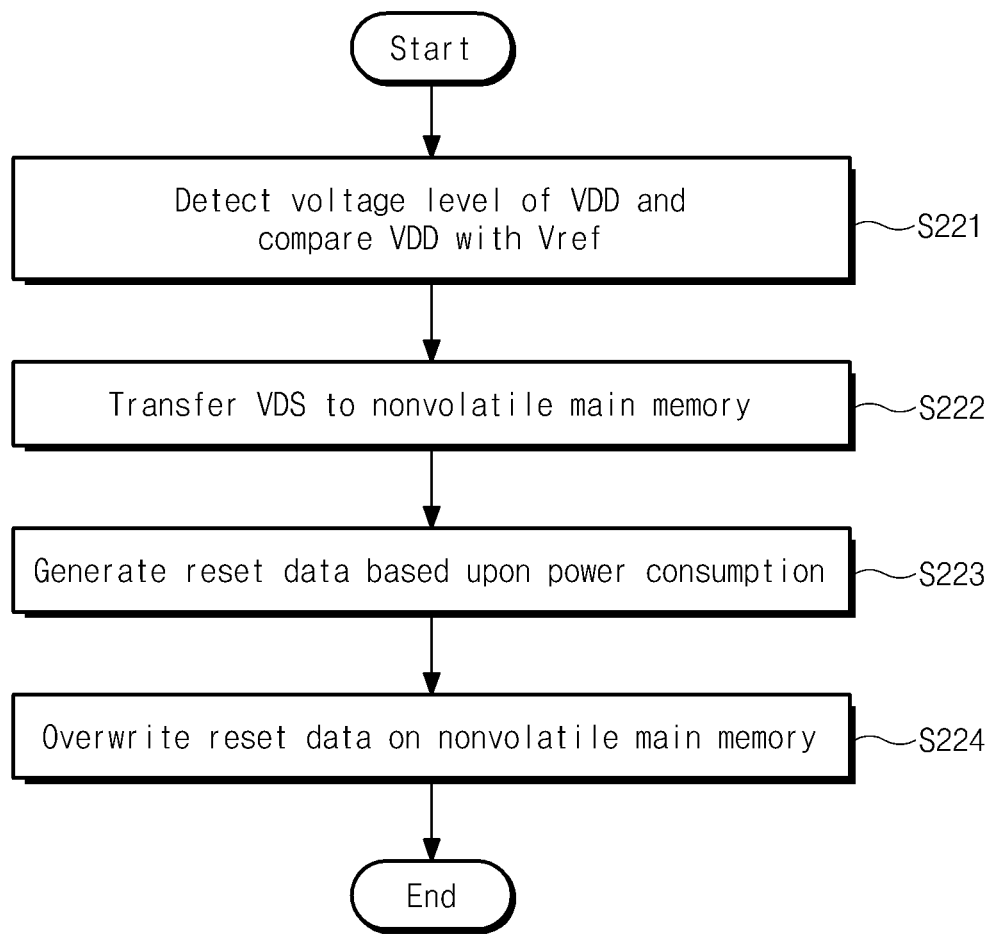
FIG. 13B is a flow chart illustrating an operation of a nonvolatile main memory of FIG. 12.

FIG. 13B is a flow chart illustrating an operation of a nonvolatile main memory of FIG. 12. In FIG. 13B, there is described an example in which a nonvolatile main memory internally detects a voltage level of a power supply voltage VDD.

In operation S221, a voltage detector 350 may detect a voltage level of the power supply voltage VDD, and may compare the detected voltage level with a reference voltage Vref.

If the detected voltage level is equal to or lower than the reference voltage Vref, in operation S222, the voltage detector 350 may generate a voltage decreasing signal VDS.

In operation S223, control logic 340 may generate reset data in response to the voltage decreasing signal VDS. That is, the control logic 340 may generate an internal power off signal IPOS in response to the voltage decreasing signal VDS, and a data input/output circuit 320 may generate reset data necessitating less current consumption in response to the internal power off signal IPOS.

In operation S224, the reset data may be overwritten at a nonvolatile main memory, for example by overwriting data currently stored in the nonvolatile main memory with the reset data.

As described with reference to FIGS. 12, 13A, and 13B, a memory system according to example embodiments of the inventive concepts may prevent a leakage of security data by invalidating data stored at a nonvolatile main memory at power-off. Also, at an invalidation operation, a power may be reduced or, alternatively, minimized by performing an overwrite operation using data necessitating less power consumption.

III. Nonvolatile Main Memory Performing Selective Overwrite Operation

Figure 14:
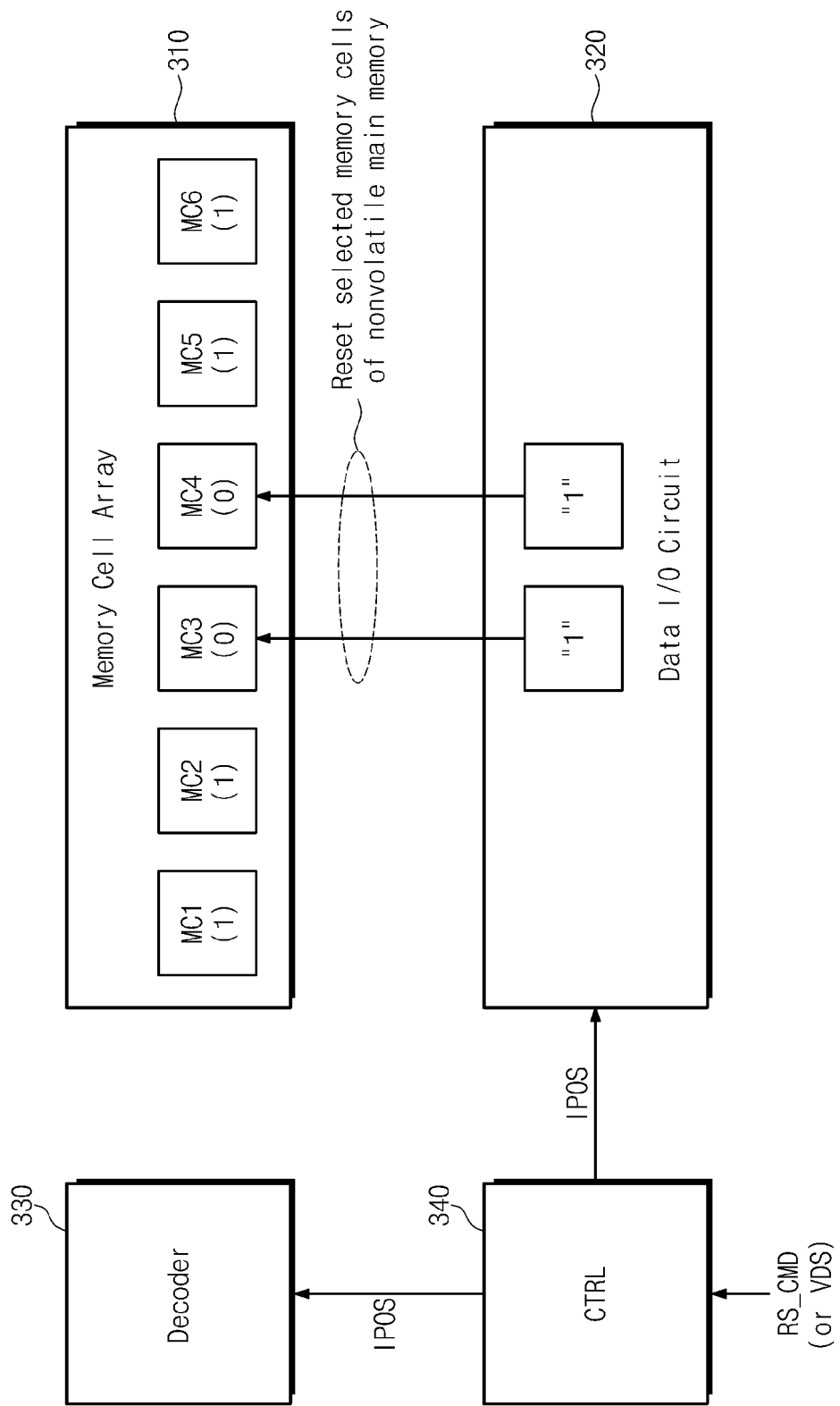
FIG. 14 is a diagram illustrating an operation of a nonvolatile main memory according to example embodiments of the inventive concepts.

FIG. 14 is a diagram illustrating an operation of a nonvolatile main memory according to example embodiments of the inventive concepts. In FIG. 14, there is illustrated an example in which there is executed an invalidation operation on memory cells having data different from reset data.

For ease of description, it is assumed that data '1' is generated as reset data. That is, it is assumed that a current needed to change data from '0' to '1' is less than a current needed to change data from '1' to '0'. Also, it is assumed that a memory cell array 310 includes first to sixth memory cells MC1 to MC6 and data '1' or '0' is stored at the first to sixth memory cells MC1 to MC6, respectively.

Referring to FIG. 14, control logic 340 may receive a reset command RS_CMD from a reset control unit 210/210_1. Alternatively, the control logic 340 may receive a voltage decreasing signal VDS from a voltage detector 350. The control logic 340 may control a data input/output circuit 320 in response to the reset command RS_CMD or the voltage decreasing signal VDS such that reset data '1' is generated.

The control logic 340 may perform an overwrite operation on memory cells, having data different with reset data, from among the memory cells MC1 to MC6. For example, as illustrated in FIG. 14, the third and fourth memory cells MC3 and MC4 may have data '0'. Thus, the control logic 340 may perform an overwrite operation on the third and fourth memory cells MC3 and MC4 of the first to sixth memory cells MC1 to MC6.

In this case, the control logic 340 may decide memory cells (e.g., MC3 and MC4) to be overwritten by performing a read operation on the first to sixth memory cells MC1 to MC6 and comparing data of the first to sixth memory cells MC1 to MC6 with the reset data. For ease of description, this operation may be referred to as a data compare write (DCW) operation.

With this DCW operation, a nonvolatile main memory according to example embodiments of the inventive concepts may prevent a leakage of security data over reducing a power consumed at an invalidation operation.

FIG. 15A is a flow chart illustrating an operation of a nonvolatile main memory of FIG. 14. In FIG. 15A, there is described an operation of a nonvolatile main memory when a reset command RS_CMD is received.

In operation S311, a memory controller 200/200_1 may receive a power off signal POS from a CPU 100/100_1.

In operation S312, a reset control unit 210/210_1 may generate a reset command RS_CMD in response to the power off signal POS, and may send the reset command RS_CMD to a nonvolatile main memory 300/300_1.

In operation S313, control logic 340 may generate reset data in response to the reset command RS_CMD. That is, the control logic 340 may generate an internal power off signal IPOS in response to the reset command RS_CMD, and a data input/output circuit 320 may generate reset data necessitating less current consumption in response to the internal power off signal IPOS.

In operation S314, memory cells to be overwritten with the reset data may be selected. For example, the control logic 340 may select memory cells to be overwritten with the reset data by performing a DCW operation.

In operation S315, an overwrite operation on the selected memory cells may be performed. Data stored at a nonvolatile main memory may be invalidated by executing an overwrite operation on the selected memory cells.

FIG. 15B is a flow chart illustrating an operation of a nonvolatile main memory of FIG. 14. In FIG. 15B, there is described an example in which a nonvolatile main memory internally detects a voltage level of a power supply voltage VDD.

In operation S321, a voltage detector 350 may detect a voltage level of the power supply voltage VDD, and may compare the detected voltage level with a reference voltage Vref.

If the detected voltage level is equal to or lower than the reference voltage Vref, in operation S322, the voltage detector 350 may generate a voltage decreasing signal VDS.

In operation S323, control logic 340 may generate reset data in response to the voltage decreasing signal VDS. That is, the control logic 340 may generate an internal power off signal IPOS in response to the voltage decreasing signal VDS, and a data input/output circuit 320 may generate reset data necessitating less current consumption in response to the internal power off signal IPOS.

In operation S324, memory cells to be overwritten with the reset data may be selected. For example, the control logic 340 may select memory cells to be overwritten with the reset data by performing a DCW operation.

In operation S325, an overwrite operation on the selected memory cells may be performed. Data stored at a nonvolatile main memory may be invalidated by executing an overwrite operation on the selected memory cells.

As described with reference to FIGS. 14, 15A, and 15B, a memory system according to example embodiments of the inventive concepts may prevent a leakage of security data by invalidating data stored at a nonvolatile main memory at power-off. In this case, a power consumed at an invalidation operation may be reduced or, alternatively, minimized by performing a data compare write operation.

IV. Nonvolatile Main Memory Performing Invalidation Operation Using Random Data

Figure 16:
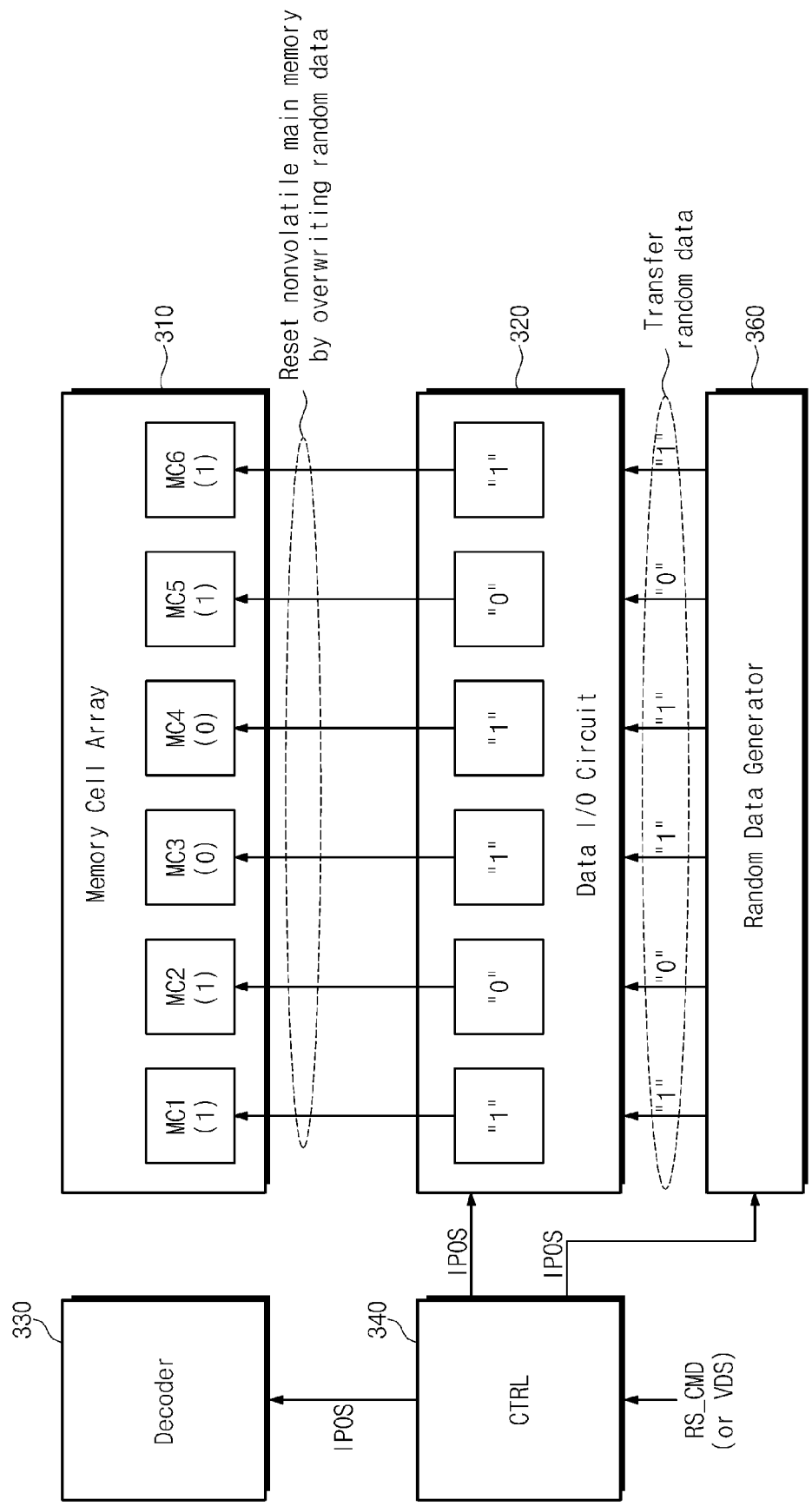
FIG. 16 is a diagram illustrating an operation of a nonvolatile main memory according to example embodiments of the inventive concepts.

FIG. 16 is a diagram illustrating an operation of a nonvolatile main memory according to example embodiments of the inventive concepts. In FIG. 16, there is illustrated an example in which there is executed an invalidation operation using random data.

For ease of description, it is assumed that a memory cell array 310 includes first to sixth memory cells MC1 to MC6. A nonvolatile main memory of FIG. 16 may be the same or substantially the same as a nonvolatile main memory 300/300_1 of FIG. 2, and a duplicated description may be omitted. The nonvolatile main memory of FIG. 16 may further include a random data generator 360.

Referring to FIG. 16, control logic 340 may receive a reset command RS_CMD from a reset control unit 210/210_1. Alternatively, the control logic 340 may receive a voltage decreasing signal VDS from a voltage detector 350.

The control logic 340 may control the random data generator 360 in response to the reset command RS_CMD or the voltage decreasing signal VDS so as to generate random data. For ease of description, it is assumed that the random data generator 360 randomly generates data '1', '0', '1', '1', '0' and '1' in the example illustrated in FIG. 16.

Afterwards, the random data generator 360 may output the random data to a data input/output circuit 320. The data input/output circuit may overwrite memory cells with the random data.

A nonvolatile main memory according to example embodiments of the inventive concepts may prevent security data from being leaked by generating random data and performing an overwrite operation using the random data.

Figure 17A:
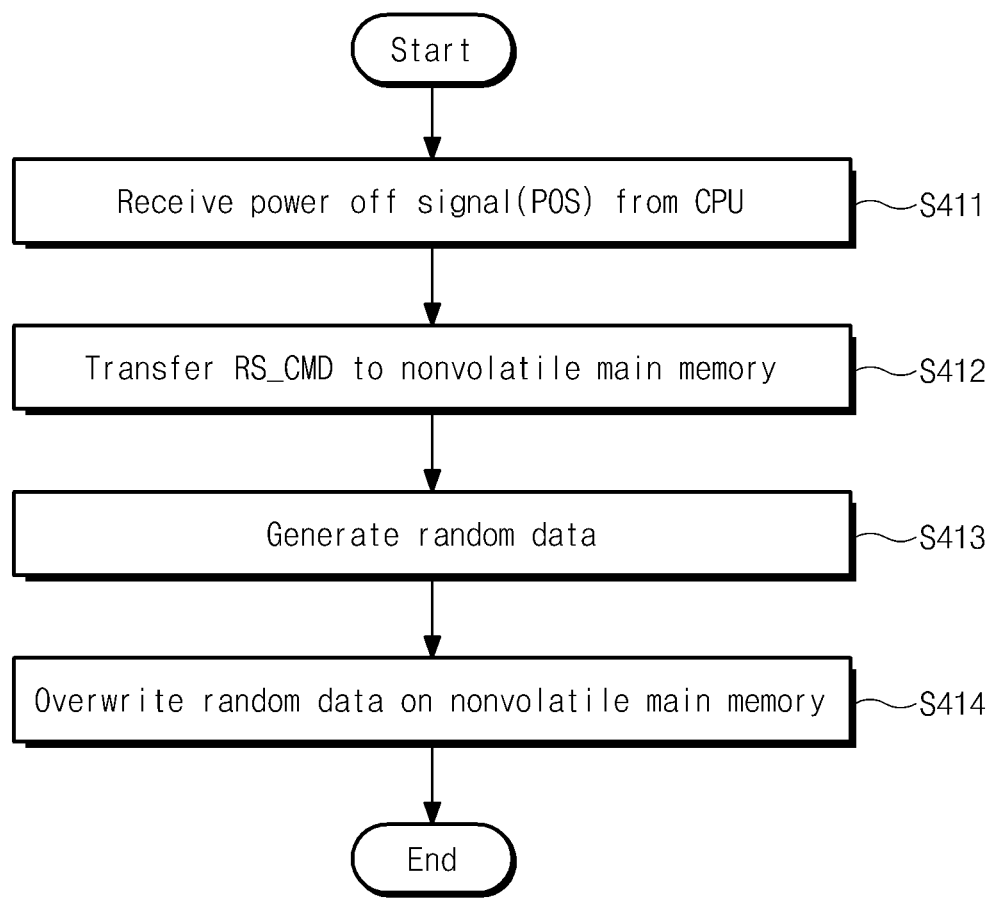
FIG. 17A is a flow chart illustrating an operation of a nonvolatile main memory of FIG. 16.

FIG. 17A is a flow chart illustrating an operation of a nonvolatile main memory of FIG. 16. In FIG. 17A, there is described an operation of a nonvolatile main memory when a reset command RS_CMD is received.

In operation S411, a memory controller 200/200_1 may receive a power off signal POS from a CPU 100/100_1.

In operation S412, a reset control unit 210/210_1 may generate a reset command RS_CMD in response to the power off signal POS, and may send the reset command RS_CMD to a nonvolatile main memory 300/300_1.

In operation S413, control logic 340 may control a random data generator 360 in response to the reset command RS_CMD so as to generate random data. Under the control of the control logic 340, the random data generator 360 may generate random data to output it to a data input/output circuit 320.

In operation S414, the random data may be overwritten at memory cells of a memory cell array 310.

Figure 17B:
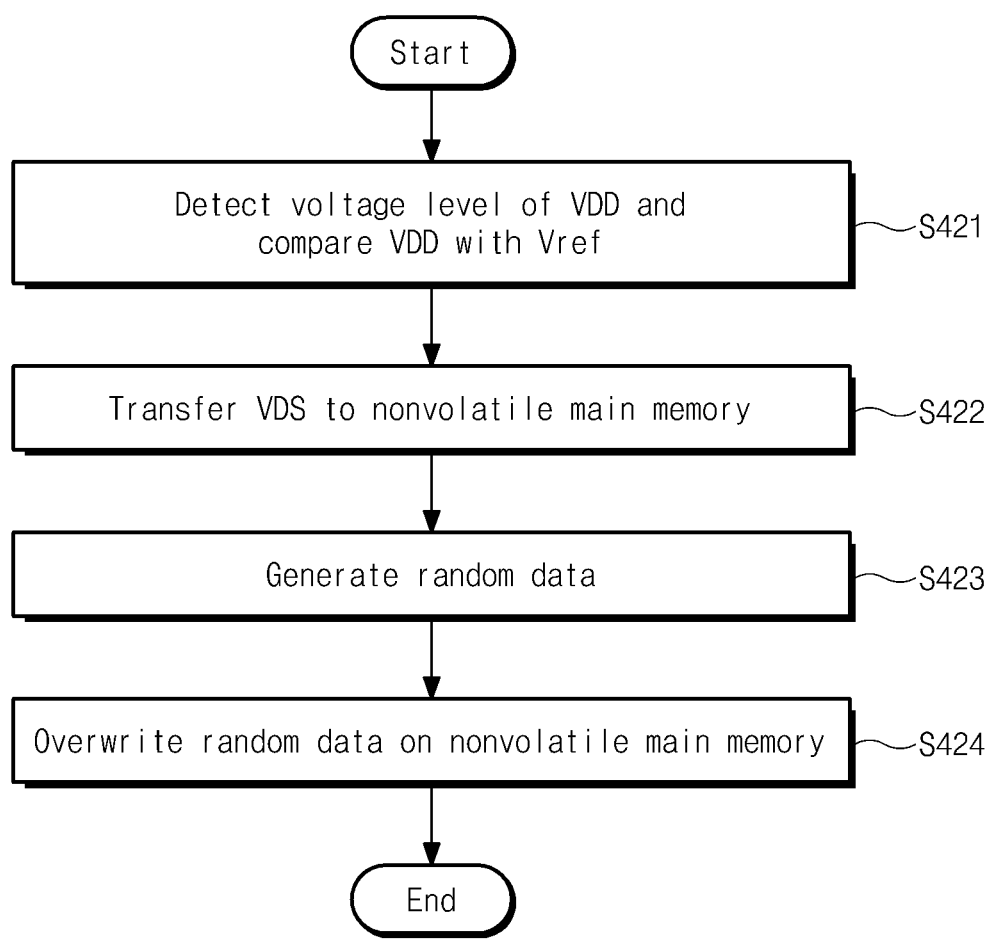
FIG. 17B is a flow chart illustrating an operation of a nonvolatile main memory of FIG. 16.

FIG. 17B is a flow chart illustrating an operation of a nonvolatile main memory of FIG. 16. In FIG. 17B, there is described an example in which a nonvolatile main memory internally detects a voltage level of a power supply voltage VDD.

In operation S421, a voltage detector 350 may detect a voltage level of the power supply voltage VDD, and may compare the detected voltage level with a reference voltage Vref.

If the detected voltage level is equal to or lower than the reference voltage Vref, in operation S422, the voltage detector 350 may generate a voltage decreasing signal VDS.

In operation S423, control logic 340 may control a random data generator 360 in response to the voltage decreasing signal VDS so as to generate random data. Under the control of the control logic 340, the random data generator 360 may generate random data to output it to a data input/output circuit 320.

In operation S424, the random data may be overwritten at memory cells of a memory cell array 310.

As described with reference to FIGS. 16, 17A, and 17B, a memory system according to example embodiments of the inventive concepts may prevent a leakage of security data by performing an overwrite operation using random data.

V. Nonvolatile Main Memory Supporting Partition Function According to Data

Below, a structure of a memory cell array 310 according to example embodiments of the inventive concepts will be described with reference to FIGS. 18-19.

Figure 18:
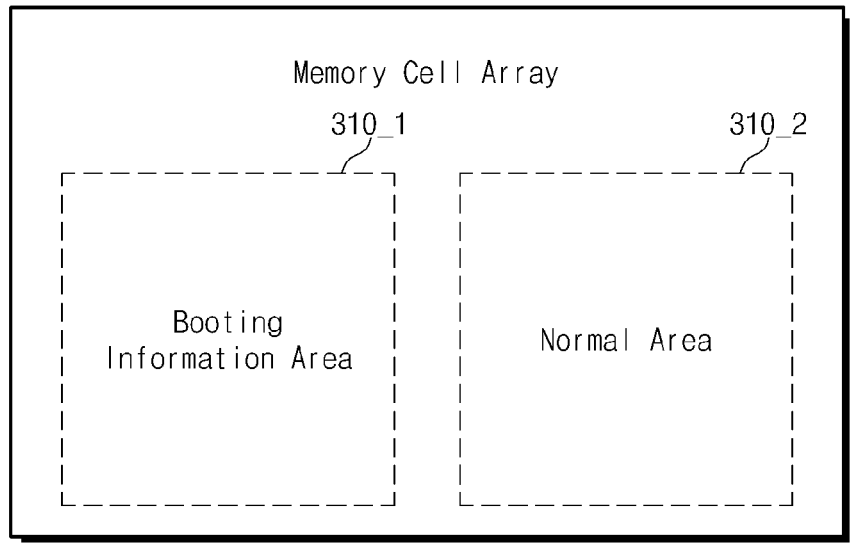
FIG. 18 is a diagram schematically illustrating a memory cell array of a nonvolatile main memory according to example embodiments of the inventive concepts.

FIG. 18 is a diagram schematically illustrating a memory cell array of a nonvolatile main memory according to example embodiments of the inventive concepts. In FIG. 18, there is illustrated an example in which a memory cell array 310 is divided into a booting information area 310_1 and a normal area 310_2.

Referring to FIG. 18, a memory cell array 310 may include a booting information area 310_1 and a normal area 310_2.

The booting information area 310_1 may be used to store information (hereinafter, referred to as booting information) needed to boot a memory system 10/10_1. For example, the booting information area 310_1 may be used to store an OS image needed to boot the memory system 10/10_1.

The normal area 310_2 may operate as a main memory on the memory system 10/10_1. For example, the normal area 310_2 may store data associated with a program running at a memory controller 200 (or, a CPU 100). Alternatively, the normal area 310_2 may store write data received from a host (not shown) or data read from a storage device 500/800.

The memory system 10/10_1 according to example embodiments of the inventive concepts may store booting information at the booting information area 310_1 of a nonvolatile main memory 300/300_1. A booting operation of the memory system 10/10_1 may be performed quickly by storing booting information at the booting information area 310_1 of the nonvolatile main memory 300/300_1.

In general, in a memory system where a volatile memory is used as a main memory, data of the main memory may be lost at power-off. Thus, information (e.g., OS image) needed for booting may be again loaded onto the main memory to drive the memory system again. In this case, a time taken to perform a booting operation may become longer. The booting time may become a critical performance index of the memory system.

On the other hand, the memory system 10/10_1 according to example embodiments of the inventive concepts may store booting information at the booting information area 310_1 of the nonvolatile main memory 300/300_1. Data stored at the normal area 310_2 may be reset (or, invalidated) at power-off, and booting information stored at the booting information area 310_1 may not be reset (or, invalidated). At rebooting, the memory system 10/10_1 may perform a booting operation using booting information stored at the booting information area 310_1. Thus, the memory system 10/10_1 may perform a booting operation quickly.

Also, the memory system 10/10_1 may not perform an invalidation operation on data stored at the booting information area 310_1 at power-off. That is, the memory system 10/10_1 may perform an invalidation operation only on data stored at the normal area 310_2 at power-off.

Figure 19:
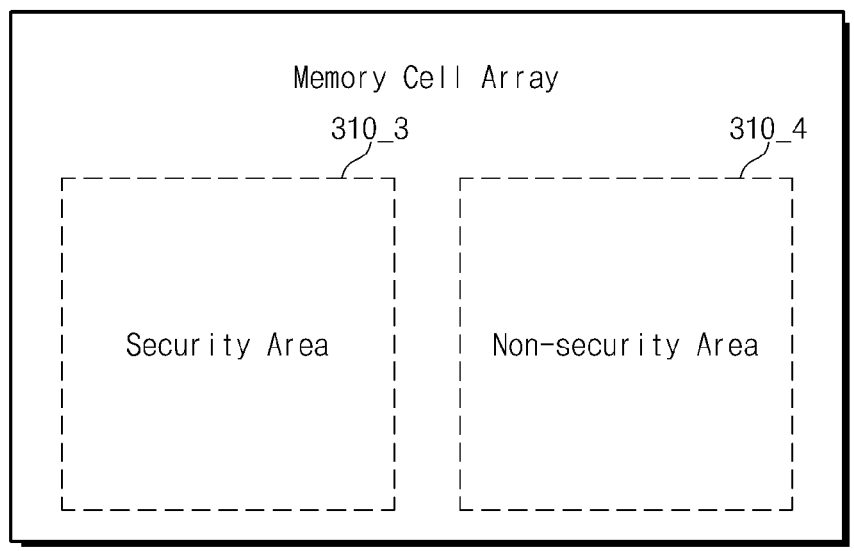
FIG. 19 is a diagram schematically illustrating a memory cell array of a nonvolatile main memory according to example embodiments of the inventive concepts.

FIG. 19 is a diagram schematically illustrating a memory cell array of a nonvolatile main memory according to example embodiments of the inventive concepts. In FIG. 19, there is illustrated an example in which a memory cell array 310 is divided into a security area 310_3 and a non-security area 310_4.

A nonvolatile main memory of FIG. 19 may be similar to that of FIG. 3. Thus, similar constituent elements may be marked by similar reference numerals, and a duplicated description may be omitted. Referring to FIG. 19, the memory cell array 310 may include the security area 310_3 and the non-security area 310_4.

The security area 310_3 may be used to store security data. For example, security data appointed by a user or securing data having predetermined file extension may be stored at the security area 310_3.

In example embodiments, the user may set a file under process to security data. For example, as the user requests storing of a file under process as security data, data under process may be set to security data. In this case, a file set to security data may be edited at the security area 310_3 of the memory cell array 310.

In other example embodiments, data having reference or, alternatively, predetermined file extension may be set to security data. For example, file extension corresponding to security data may be previously decided. For example, file extension corresponding to security data may be decided at a booting operation.

The non-security data 310_4 may be used to store non-security data. For example, non-security data may be data not appointed by a user. Alternatively, non-security data may be data having reference or, alternatively, predetermined file extension. Still alternatively, non-security data may be data defined by a user.

A memory system 10/10_1 may perform an invalidation operation on data stored at the security area 310_3 at power-off. That is, the memory system 10/10_1 may not perform an invalidation operation on data stored at the non-security area 310_4 at power-off.

The memory system 10/10_1 may prevent security data from being leaked by dividing a nonvolatile main memory 300/300_1 into the security area 310_3 and the non-security area 310_4 and performing an invalidation operation only on the security area 310_3. A power consumed to invalidate the non-security data may be reduced by not performing an invalidation operation on non-security data.

Figure 20:
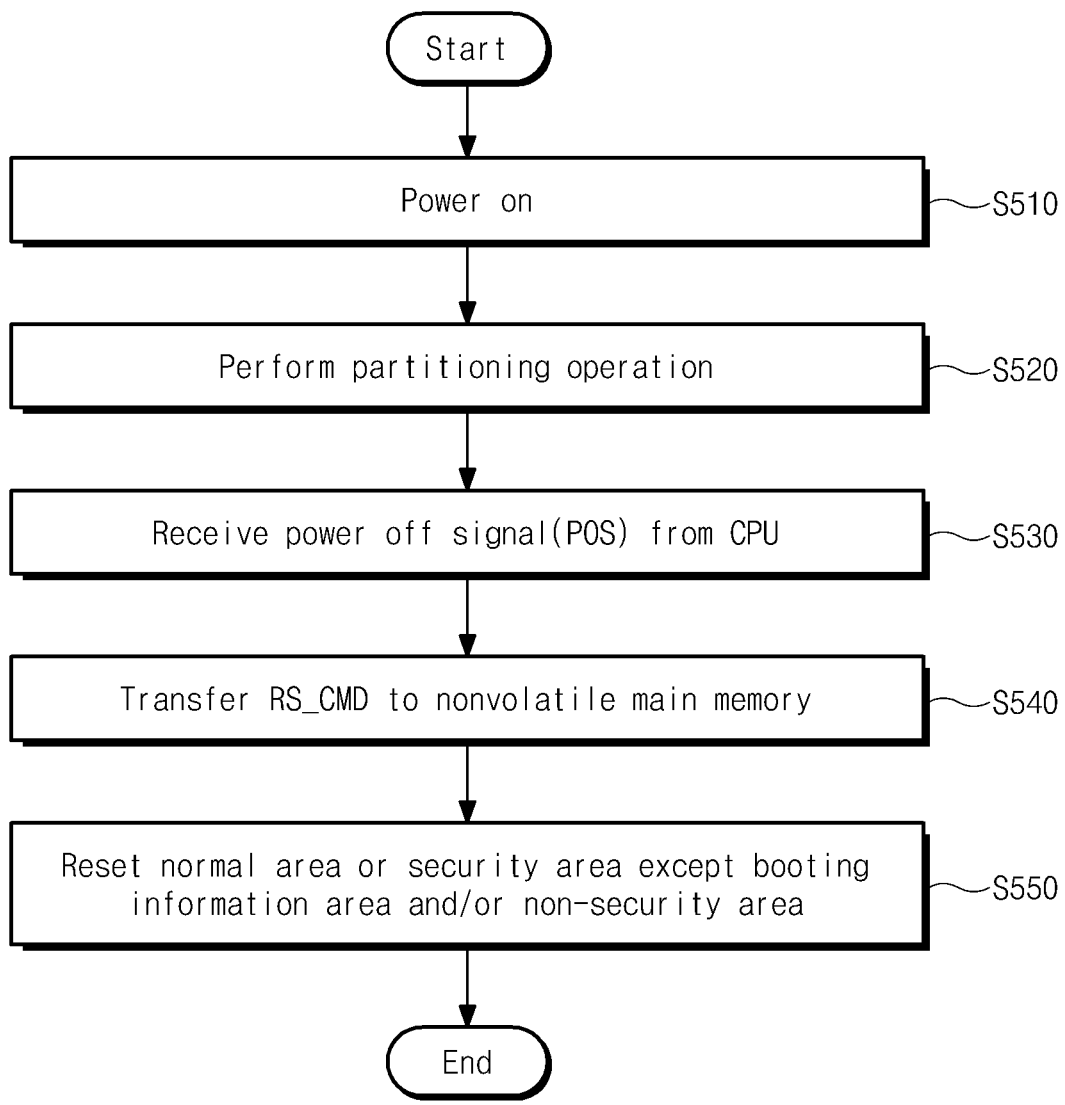
FIG. 20 is a flow chart illustrating an operation of a nonvolatile main memory described in FIGS. 18 and 19.

FIG. 20 is a flow chart illustrating an operation of a nonvolatile main memory described in FIGS. 18 and 19.

In operation S510, a memory system 10/10_1 may be powered on. In this case, a booting operation on the memory system 10/10_1 may be executed.

In operation S520, a partition operation may be performed. That is, when the booting operation is performed, an operation for partitioning a nonvolatile main memory 300/300_1 may be performed. A partition operation may be performed by a bank or block unit of a memory cell array. Also, the partition operation may be implemented by setting a register 341 with partition information using a mode setting operation of a memory controller 200.

As described with reference to FIG. 18, the nonvolatile main memory may be divided into a booting information area 310_1 and a normal area 310_2. Alternatively, as described with reference to FIG. 189, the nonvolatile main memory may be divided into a security area 310_3 and a non-security area 310_4. However, the inventive concepts are not limited thereto. For example, the nonvolatile main memory may be divided into the booting information area 310_1, the normal area 310_2, the security area 310_3, and the non-security area 310_4.

In operation S530, a CPU 100/100_1 may send a power off signal POS to a memory controller 200/200_1.

In operation S540, a reset control unit 210/210_1 may send a reset command RS_CMD to a nonvolatile main memory 300/300_1 in response to the power off signal POS.

In operation S550, there may be performed an invalidation operation on an area, necessitating a reset operation, from among partitioned areas. For example, as described with reference to FIG. 18, there may be performed an invalidation operation on the normal area 310_2 except for the booting information area 310_1. Alternatively, as described with reference to FIG. 19, there may be performed an invalidation operation on the security area 310_3 except for the non-security area 310_4.

Similarly with a case described with reference to FIGS. 13B, 15B, and 17B, the nonvolatile main memory according to example embodiments of the inventive concepts may detect a voltage level of a power supply voltage VDD. In this case, operations S530 and S540 may be replaced with operations of detecting a voltage level of the power supply voltage VDD and transferring a voltage decreasing signal VDS to control logic 340. At this time, operations S510, S540, and S550 may be performed in the same manner.

As described with reference to FIGS. 18 to 20, the memory system 10/10_1 according to example embodiments of the inventive concepts may support a function of partitioning the nonvolatile main memory 30/300_1. As the nonvolatile main memory 30/300_1 is partitioned and an invalidation operation on a normal area or an area necessitating security is performed, the memory system 10/10_1 may prevent a leakage of security data over reducing a power consumed at an invalidation operation.

Meanwhile, the above description may be exemplary, and example embodiments of the inventive concepts is not limited thereto. Below, various embodiments according to example embodiments of the inventive concepts will be described.

VI. Controller Including Super Capacitor

Figure 21:
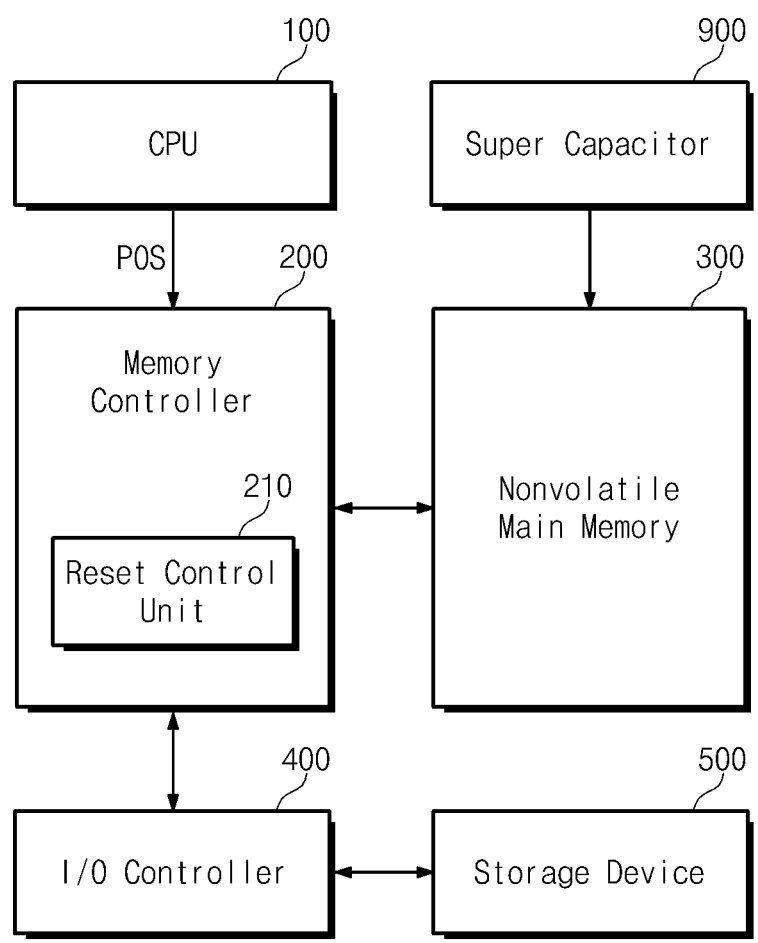
FIG. 21 is a block diagram schematically illustrating a memory system according to example embodiments of the inventive concepts.

FIG. 21 is a block diagram schematically illustrating a memory system 10_2 according to example embodiments of the inventive concepts.

A memory system 10_2 of FIG. 21 may be similar to a memory system 10 of FIG. 1. Thus, similar or identical components may be marked by similar or identical reference numerals. Also, for ease of description, a duplicated description is omitted.

Compared with the memory system 10 of FIG. 1, the memory system 10_2 of FIG. 21 may further comprise a super capacitor 900. The super capacitor 900 may be used to supply a power consumed at an invalidation operation of a nonvolatile main memory when an externally supplied power is interrupted.

For example, at sudden power-off, a power supplied from the external may be interrupted before an invalidation operation is executed. In this case, the memory system 10_2 may perform the invalidation operation on a nonvolatile main memory 300 using a power stored at the super capacitor 900.

As described with reference to FIG. 21, the memory system 10_2 may stably perform the invalidation operation on the nonvolatile main memory 300 using the super capacitor 900.

VII. Controller Including Power Detect Unit

Figure 22:
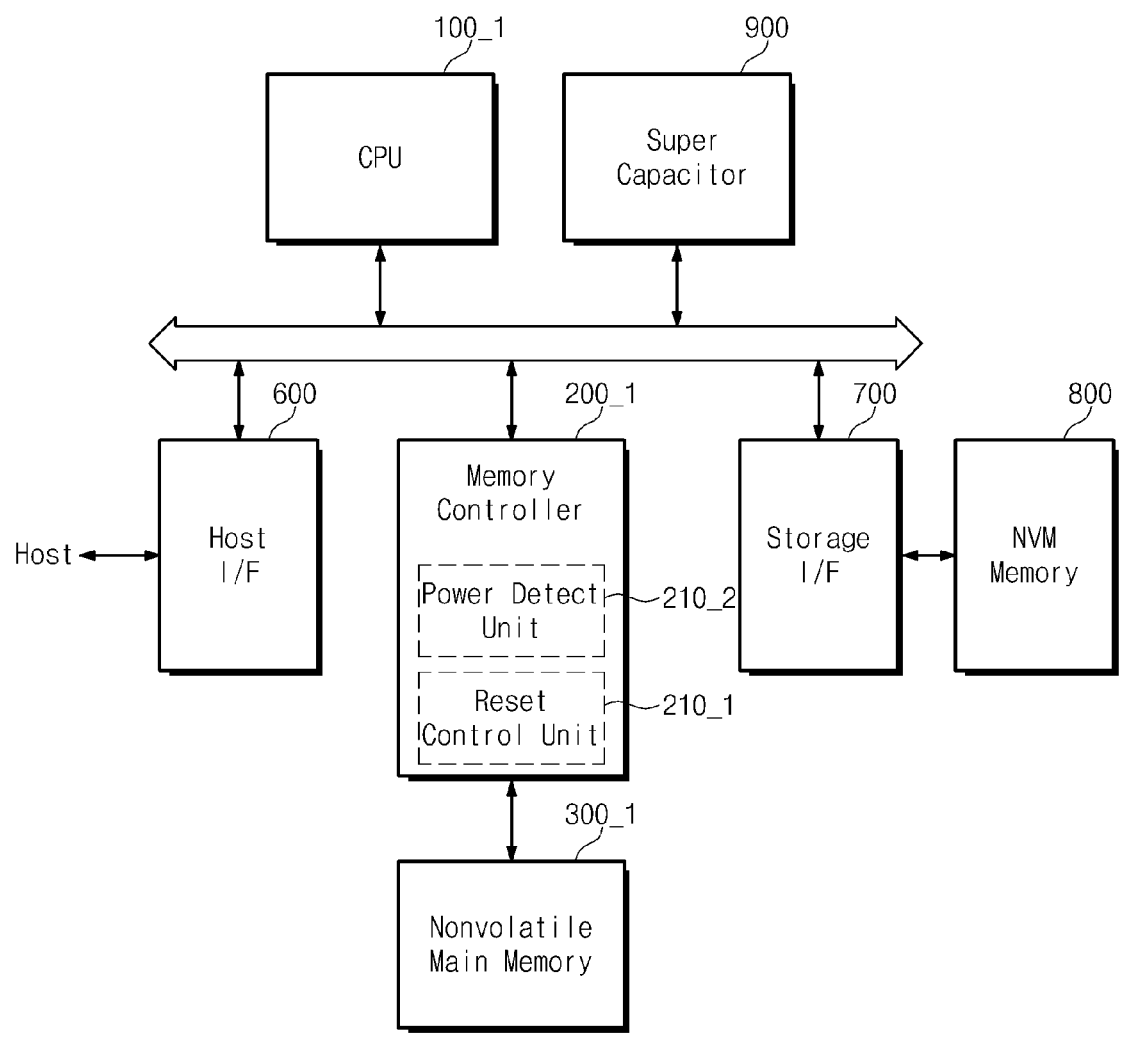
FIG. 22 is a block diagram schematically illustrating a memory system according to still example embodiments of the inventive concepts.

FIG. 22 is a block diagram schematically illustrating a memory system 10_2 according to still example embodiments of the inventive concepts.

A memory system 10_3 of FIG. 22 may be similar to a memory system 10_2/10_3 of FIG. 2/21. Thus, similar or identical components may be marked by similar or identical reference numerals. Also, for ease of description, a duplicated description is omitted.

The memory system 10_3 of FIG. 22 may be similar to the memory system 10_2/10_3 of FIG. 2/21 except that a power detect unit 210_2 is further included.

The power detect unit 210_2 may detect whether an externally supplied power is interrupted, in real time or periodically. If an externally supplied power is interrupted, the power detect unit 210_2 may transfer a power off signal POS indicating interruption of a power to a reset control unit 210_1.

The reset control unit 210_1 may send a reset command to a nonvolatile main memory 300_1 in response to the power off signal POS from the power detect unit 210_2. The nonvolatile main memory 300_1 may perform an invalidation operation in response to the reset command. Thus, the memory system 10_3 may perform an invalidation operation even at sudden power-off.

In example embodiments, the power off signal POS can be provided from an external device or generated internally. A component of generating the power off signal POS may not be limited.

VIII. Nonvolatile Main Memory Including Memory Chips

FIGS. 23 to 26 are block diagrams schematically illustrating structures of memory systems 10_4 to 10_7 according to example embodiments of the inventive concepts. In FIGS. 23 to 26, each of memory systems 10_4 to 10_7 may include a nonvolatile main memory formed of a memory module.

The memory systems 10_4 to 10_7 of FIGS. 23 to 26 may be similar to the above-described memory system. Thus, similar or identical components may be marked by similar or identical reference numerals. Also, for ease of description, a duplicated description is omitted.

Figure 23:
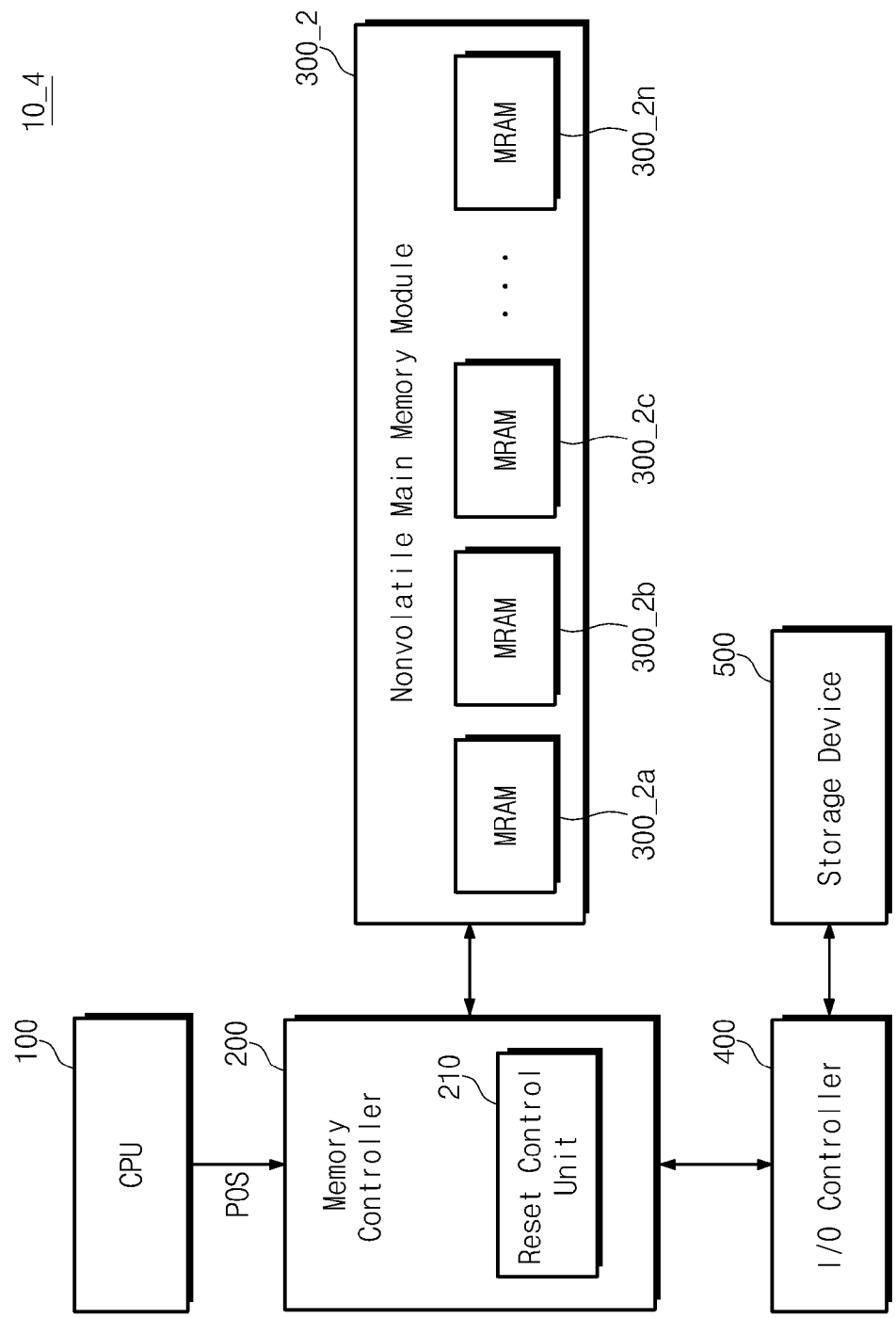
FIGS. 23 to 26 are block diagrams schematically illustrating structures of memory systems according to example embodiments of the inventive concepts.

Referring to FIG. 23, the memory system 10_4 may include a nonvolatile main memory module 300_2. The nonvolatile main memory module 300_2 may include a plurality of memory chips 300_2a to 300_2n. It is assumed that the memory chips 300_2a to 300_2n of the nonvolatile main memory module 300_2 are formed of MRAM.

In example embodiments, the memory system 10_4 may perform an invalidation operation on the memory chips 300_2a to 300_2n of the nonvolatile main memory module 300_2 at power-off. Thus, it is possible to prevent security data from being leaked.

The memory chips 300_2a to 300_2n of the nonvolatile main memory module 300_2 may perform write operations in parallel. Thus, a large power may be required to perform the invalidation operation on the memory chips 300_2a to 300_2n of the nonvolatile main memory module 300_2.

To reduce power consumption, the memory system 10_4 may perform an invalidation operation on a predetermined memory chip of the memory chips 300_2a to 300_2n. Thus, the memory system 10_4 may reduce a power consumed at the invalidation operation. In this case, a memory chip to be invalided at power-off may be decided by mode setting of a memory controller. This may be performed, for example, in the same manner described with reference to memory areas 310_3 and 310_4 of FIG. 19, and a description thereof is thus omitted.

In example embodiments, the memory system 10_4 may store booting information at a predetermined memory chip of the memory chips 300_2a to 300_2n of the nonvolatile main memory module 300_2. The memory chip storing the booting information may not be invalidated. Also, the nonvolatile main memory module 300_2 may support a fast booting operation by performing a booting operation using booting information stored at a predetermined memory chip. This may be similar to that described with reference to FIG. 18, and a description thereof is thus omitted.

Figure 24:
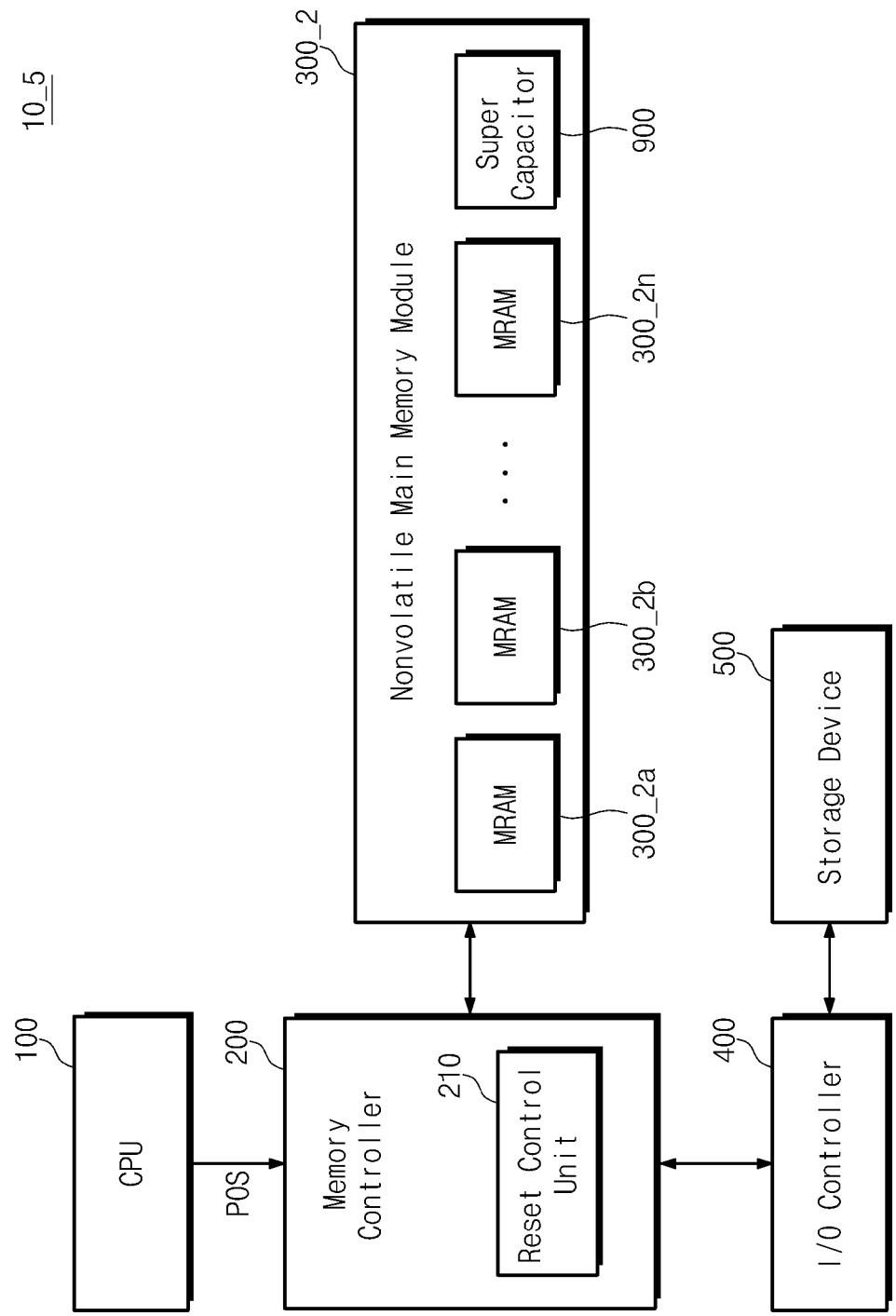

Referring to FIG. 24, the memory system 10_5 may further comprise a super capacitor 900 compared with the memory system 10_4 of FIG. 23. The super capacitor 900 may be included in the nonvolatile main memory module 300_2, and may supply a power for an invalidation operation to the nonvolatile main memory module 300_2 at power-off. The memory system 10_5 may perform an invalidation operation stably using the super capacitor 900. This may be similar to that described with reference to FIG. 21, and a description thereof is thus omitted.

In FIG. 24, there is illustrated an example in which the super capacitor 900 is included in the nonvolatile main memory module 300_2. However, example embodiments of the inventive concepts are not limited thereto. For example, as illustrated in FIG. 25, the memory system 10_6 may include the super capacitor 900 which is located outside the nonvolatile main memory module 300_2.

Figure 25:
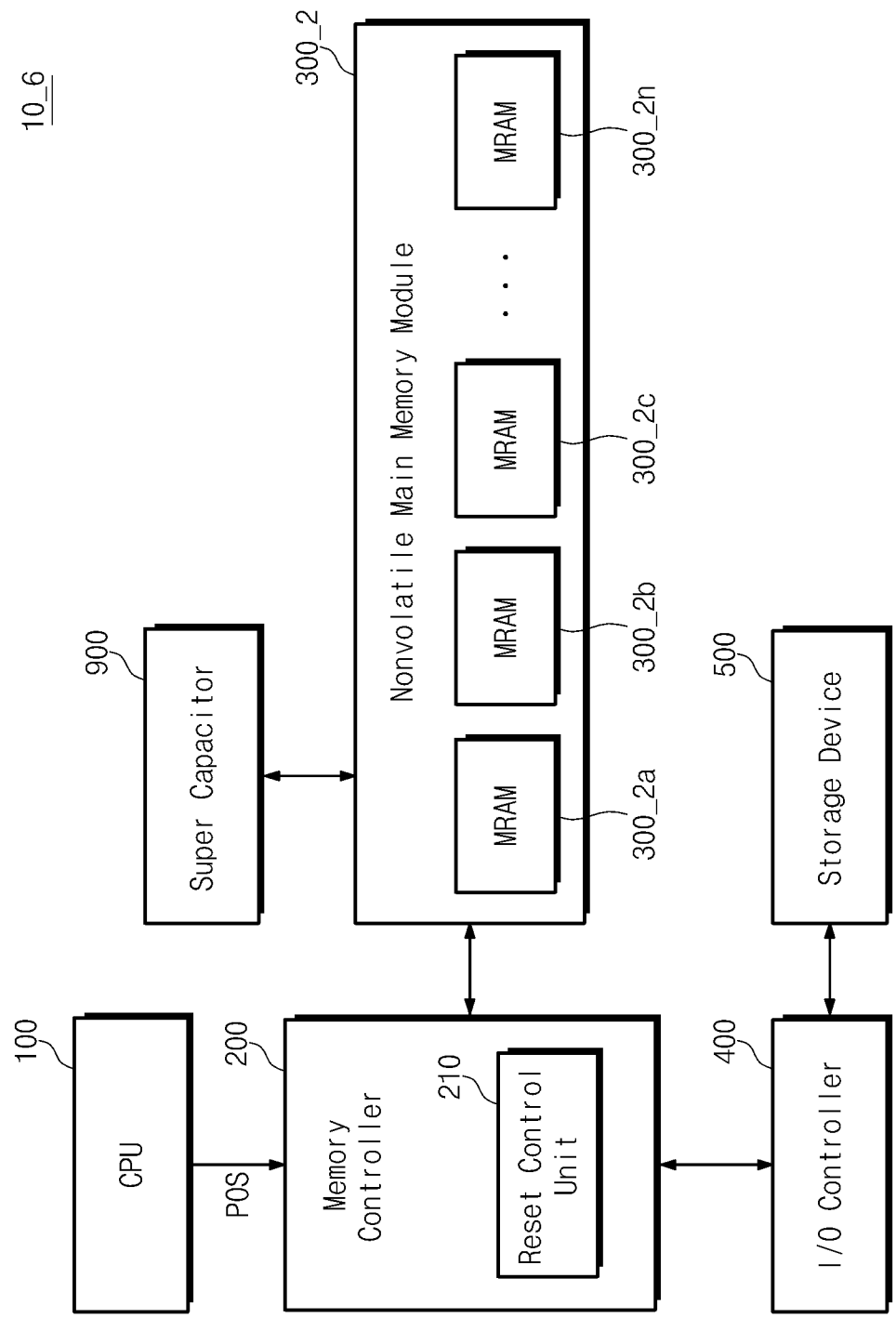
Figure 26:
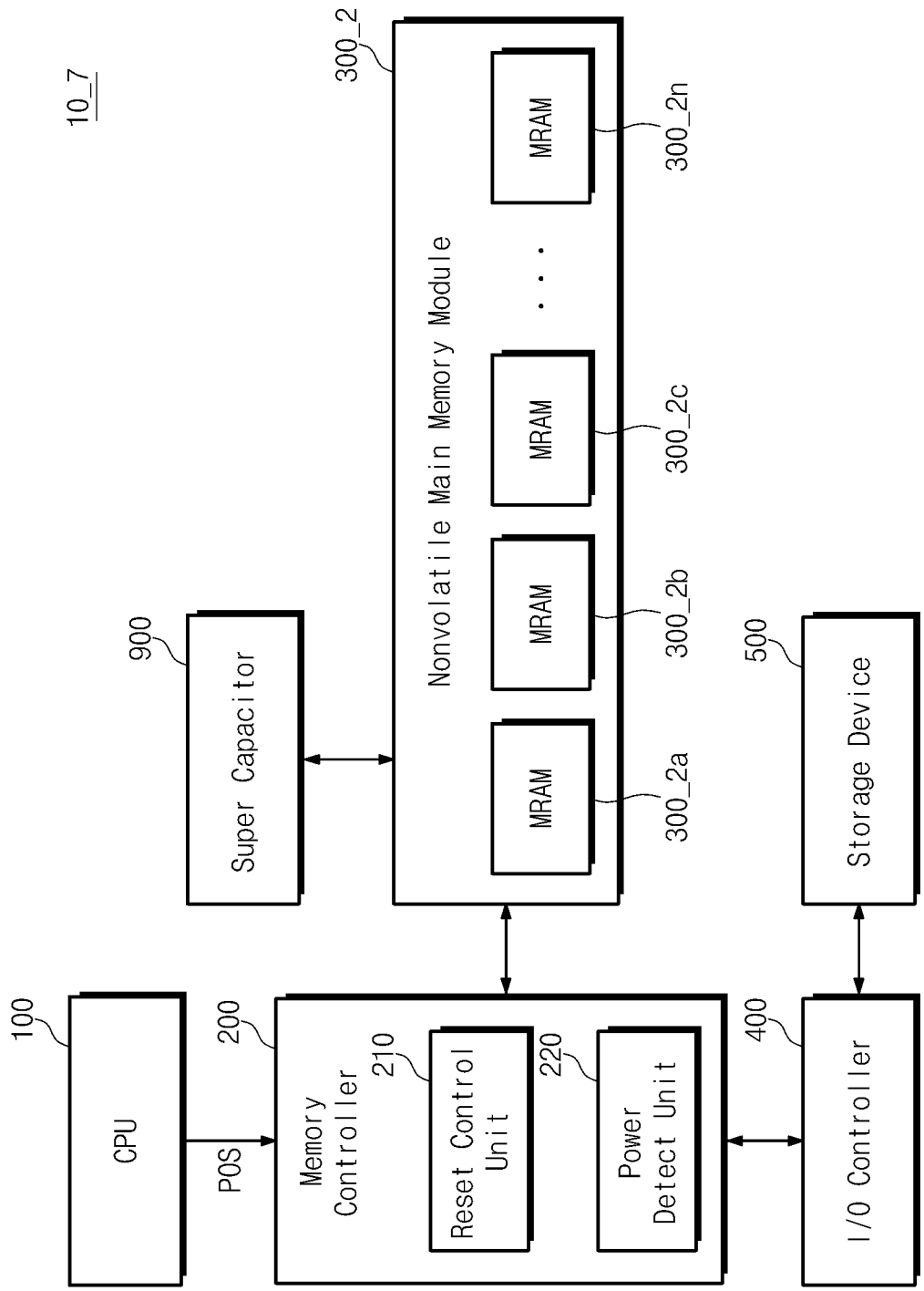

Referring to FIG. 26, the memory system 10_7 may further include a power detect unit 220 compared with the memory system 10_6 of FIG. 25. The power detect unit 220 may detect whether an externally supplied power is interrupted, in real time or periodically.

As described with reference to FIGS. 23 to 26, the memory system of example embodiments of the inventive concepts may include a memory module having nonvolatile memory chips as a main memory, so that security data stored at the memory module is prevented from being leaked.

IX. Hybrid Main Memory Including Nonvolatile Memory and Volatile Memory

Figure 27:
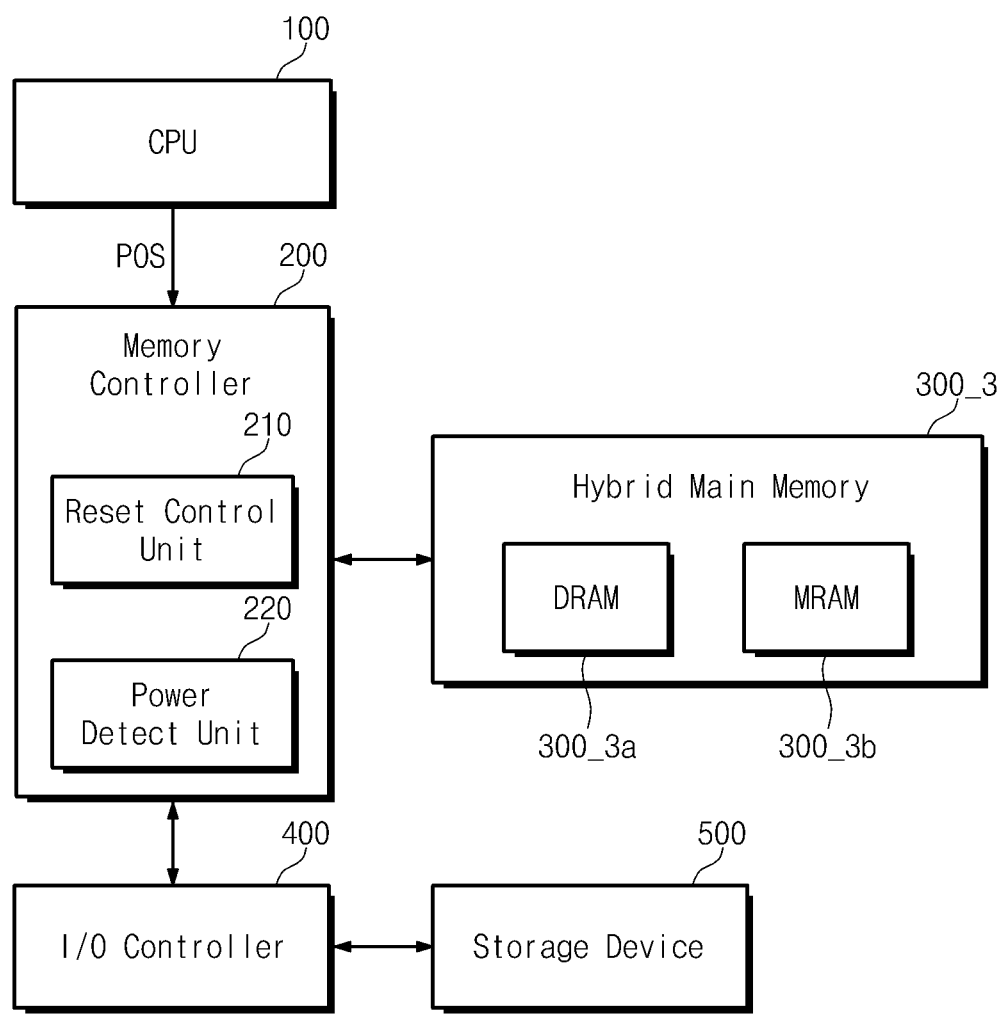
FIG. 27 is a block diagram schematically illustrating a memory system according to still example embodiments of the inventive concepts.

FIG. 27 is a block diagram schematically illustrating a memory system 10_8 according to example embodiments of the inventive concepts. A memory system 10_8 of FIG. 27 may be similar to a memory system 10 of FIG. 1. Thus, similar or identical components may be marked by similar or identical reference numerals. Also, a duplicated description may be omitted for ease of description.

Referring to FIG. 27, the memory system 10_8 may include a hybrid main memory 300_3 instead of a nonvolatile main memory 300 of FIG. 1.

The hybrid main memory 300_3 may include a volatile memory and a nonvolatile memory. For ease of description, it is assumed that the hybrid main memory 300_3 includes a DRAM and an MRAM. However, the inventive concepts are not limited thereto.

A reset control unit 210 may invalidate an MRAM 300_3b of the hybrid main memory 300_3 in response to a power off signal POS. For example, in the event that security data is stored at the MRAM 300_3b, a leakage of security data may be prevented by invalidating the MRAM 300_3b. However, the inventive concepts are not limited thereto. For example, security data may be stored at the DRAM 300_3a, and non-security data may be stored at the MRAM 300_3b. Also, booting information may be stored at the MRAM 300_3b. In this case, the memory system 10_8 may not invalidate the MRAM 300_3b.

The MRAM 300_3b and the DRAM 300_3a may exchange data with a memory controller 130 using a DRAM interface manner.

Various embodiments on a nonvolatile memory and a memory system may be described. A memory system to which the spirit of example embodiments of the inventive concepts is applied may be a computer system using a nonvolatile memory as a main memory, a solid state storage device using a nonvolatile memory as a buffer memory of a nonvolatile memory storage device, a hard disk storage device using a nonvolatile memory as a buffer memory of a hard disk driver, or a memory card including a memory controller in which a nonvolatile memory is embedded.

There is described an example in which data is invalidated according to a detected power-off state. However, example embodiments of the inventive concepts are not limited thereto. Example embodiments of the inventive concepts may be changed or modified such that data is invalidated at power-on. In this case, at power-on, a voltage detector 350 of a nonvolatile main memory 300 in FIG. 3 may detect a variation in a power supply voltage to generate a voltage increasing signal VIS. In response to the voltage increasing signal VIS, control logic 340 may control a nonvolatile main memory such that data is invalidated. Also, the memory system of example embodiments of the inventive concepts may be configured to generate a signal POS, generated at power-off, even at power-on. In response to the signal POS, a memory controller may output a reset command to a nonvolatile main memory. In response to the reset command, the nonvolatile main memory may invalidate data. That is, the spirit of example embodiments of the inventive concepts may be applied to a structure in which data is invalidated at power-on or at power-off.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A nonvolatile memory comprising:
 a memory cell array including a plurality of nonvolatile memory cells;
 a decoder connected with the memory cell array through a plurality of word lines;
 a data input/output circuit connected with the memory cell array through a plurality of bit lines;
 a voltage detector configured to detect a variation in a power supply voltage to output a voltage variation signal; and
 control logic configured to control the decoder and the data input/output circuit such that data stored at the memory cell array is invalidated in response to the voltage variation signal.

2. The nonvolatile memory of claim 1, wherein the voltage detector is configured to detect whether the power supply voltage is lower than a threshold level, and to output the voltage variation signal according to the detection result.

3. The nonvolatile memory of claim 1, wherein the control logic is configured to invalidate the data by controlling the decoder and the data input/output circuit such that the nonvolatile memory cells of the memory cell array are overwritten with data '1' or data '0'.

4. The nonvolatile memory of claim 3, wherein the control logic is configured to control the decoder and the data input/output circuit such that the nonvolatile memory cells of the memory cell array are overwritten with data, from among data '1' and data '0', that necessitates a least power consumption with respect to the overwriting.

5. The nonvolatile memory of claim 3, further comprising:
 a register configured to be set by an external device,
 wherein the control logic is further configured to,
  determine whether to invalidate the data stored at the memory cell array in response to the voltage variation signal according to information set at the register and,
  perform invalidation selectively on the data according to the determining result.

6. The nonvolatile memory of claim 4, wherein the control logic is further configured to,
 determine whether the nonvolatile memory cells are overwritten with data '1' or data '0' at invalidation of the data, according to information of the register, and
 perform an overwrite operation using the determined data.

7. The nonvolatile memory of claim 2, further comprising:
a random data generator configured to generate random data in response to a control of the control logic,
wherein the control logic is configured to control the decoder and the data input/output circuit such that the nonvolatile memory cells are overwritten with the random data from the random data generator.

8. The nonvolatile memory of claim 1, wherein the memory cell array includes at least two areas storing different characteristics of data, and data stored at the at least two areas is selectively invalidated in response to the voltage variation signal.

9. The nonvolatile memory of claim 8, further comprising:
a register configured to be set by an external device,
wherein the control logic is configured to decide that a first one of the at least two areas is an area to be invalided and a second one of the at least two areas is an area not to be invalidated, based on the information of the register.

10. The nonvolatile memory of claim 1, wherein the memory cell array comprises:
a booting information area configured to store booting information; and
a normal area configured to store user data, and
wherein the nonvolatile memory is configured such that the user data stored at the normal area is invalidated in response to the voltage variation signal and the booting information stored at the booting information area is not invalidated in response to the voltage variation signal.

11. The nonvolatile memory of claim 1, wherein the memory cell array comprises:
a security area configured to store security data; and
a non-security area configured to store non-security data, and
wherein the nonvolatile memory is configured such that the security data stored at the security area is invalidated in response to the voltage variation signal and the non-security data stored at the non-security area is not invalidated in response to the voltage variation signal.

12. The nonvolatile memory of claim 1, further comprising:
a super capacitor configured to supply a power at power-off, and
wherein the control logic is further configured to invalidate data stored at the memory cell array using a power from the super capacitor at power-off, power-off being a state in which power that is externally provided to the nonvolatile memory is cut off.

13. The nonvolatile memory of claim 1, wherein the control logic is further configured to invalidate data stored at the memory cell array in response to a reset command from an external device.

14. The nonvolatile memory of claim 1, wherein the nonvolatile memory is a random access memory.

15. The nonvolatile memory of claim 1, wherein the nonvolatile memory is a magnetic random access memory (MRAM).

16. A memory system comprising:
a nonvolatile memory; and
a memory controller configured to control the nonvolatile memory,
wherein the nonvolatile memory includes,
a memory cell array including a plurality of nonvolatile memory cells;
a decoder connected with the memory cell array through a plurality of word lines;
a data input/output circuit connected with the memory cell array through a plurality of bit lines;
a voltage detector configured to detect a variation in a power supply voltage to output a voltage variation signal; and
control logic configured to control the decoder and the data input/output circuit such that data stored at the memory cell array is invalidated in response to the voltage variation signal.

17. A memory system comprising:
a nonvolatile main memory including a plurality of nonvolatile memory chips; and
a memory controller configured to control the nonvolatile main memory,
wherein the memory controller is configured to detect a variation in a power supply voltage and to control the nonvolatile main memory such that at least one nonvolatile memory chip of the plurality of nonvolatile memory chips is invalidated based on the detected variation.

18. The memory system of claim 17, wherein the at least one invalidated nonvolatile memory chip is previously selected by the memory controller.

19. The memory system of claim 17, wherein the nonvolatile main memory further comprises:
a super capacitor configured to power the at least one nonvolatile memory chip at power-off, power-off being a state in which power that is externally provided to the memory system is cut off.

20. The memory system of claim 17, further comprising:
a super capacitor located outside the nonvolatile main memory and configured to power the nonvolatile main memory, and
wherein the nonvolatile main memory is configured such that, at power-off, the at least one nonvolatile memory chip performs an invalidation operation on stored data using power supplied from the super capacitor, power-off being a state in which power that is externally provided to the memory system is cut off.

21. The memory system of claim 17, wherein the nonvolatile main memory is configured such that the at least one nonvolatile memory chip detects whether a power supply voltage is lower than a predetermined level and performs an invalidation operation on stored data according to the detection result.

22. The memory system of claim 17, wherein the memory controller is configured to detect a power-off and to send a reset command to the at least one nonvolatile memory chip based on the detected power-off, and the nonvolatile memory is configured such that the at least one nonvolatile memory chip performs an invalidation operation on stored data in response to the reset command.

23. An operating method of a nonvolatile memory which includes a plurality of nonvolatile memory cells, comprising:
detecting a variation in a power supply voltage; and
invalidating data stored at the plurality of nonvolatile memory cells in response to the detecting.

24. The operating method of claim 23, wherein the invalidating data stored at the plurality of nonvolatile memory cells comprises:
overwriting the plurality of nonvolatile memory cells with data.

25. The operating method of claim 23, wherein the invalidating data stored at the plurality of nonvolatile memory cells comprises:
reading data stored at the plurality of nonvolatile memory cells;

deciding which data, from among data '1' and data '0', necessitates less power consumption for overwriting of a part or all of the plurality of nonvolatile memory cells, based on the read data; and overwriting the part or all of the plurality of nonvolatile memory cells with the data decided as necessitating less power consumption.

26. The operating method of claim 23, wherein the invalidating data stored at the plurality of nonvolatile memory cells comprises:

generating random data; and overwriting the plurality of nonvolatile memory cells with the random data.

27. The operating method of claim 23, further comprising:

receiving a reset command indicating that a variation in the power supply voltage is detected; and invalidating data stored at the plurality of nonvolatile memory cells in response to the reset command.

28. The operating method of claim 23, wherein the invalidating data stored at the plurality of nonvolatile memory cells is performed using a power stored at a super capacitor.

29. The operating method of claim 23, wherein the invalidating data stored at the plurality of nonvolatile memory cells is performed selectively according to data stored at a mode register.

30. A computing system comprising:

a nonvolatile main memory;

a memory controller configured to control the nonvolatile main memory; and a central processing unit configured to access the nonvolatile main memory via the memory controller and to use the nonvolatile main memory as a working memory, wherein the nonvolatile main memory includes, a memory cell array including a plurality of nonvolatile memory cells, a decoder connected with the memory cell array through a plurality of word lines, a data input/output circuit connected with the memory cell array through a plurality of bit lines, a voltage detector configured to detect a variation in a power supply voltage to output a voltage variation signal, and control logic configured to control the decoder and the data input/output circuit such that data stored at the memory cell array is invalidated in response to the voltage variation signal.

31. A nonvolatile memory comprising:

a memory cell array including a plurality of nonvolatile memory cells;

a voltage detector configured to detect a variation in a power supply voltage being supplied to the nonvolatile memory and to output a voltage variation signal; and a controller configured to perform an overwriting operation on the memory cell array in response to the voltage variation signal, the overwriting operation causing data stored at the memory cell array to be overwritten with reset data.

32. The nonvolatile memory of claim 31 further comprising:

a decoder connected with the memory cell array through a plurality of word lines; and a data interface circuit configured to input data to, and output data from, the nonvolatile memory, the data interface being connected with the memory cell array through a plurality of bit lines, wherein the controller is configured such that performing the overwriting operation includes controlling the decoder and the data interface circuit to overwrite data stored at the memory cell array with the reset data.

33. The nonvolatile memory of claim 31 wherein, the reset data is one of first data values and second data values, power consumption corresponding to performing the overwriting operation using the first data values as the reset data is different from power consumption corresponding to performing the overwriting operation using the second data values as the reset data, and the nonvolatile memory controller is configured to perform the overwriting operation using, as the reset data, the data values which correspond to the lowest power consumption, from among the first data values and the second data values.

34. The nonvolatile memory of claim 33, wherein the first data values are '0's and the second data values are '1's.

* * * * *